(12) United States Patent
Noguchi et al.

(10) Patent No.: US 9,990,975 B2
(45) Date of Patent: Jun. 5, 2018

(54) NONVOLATILE SEMICONDUCTOR MEMORY

(71) Applicant: Toshiba Memory Corporation, Minato-ku (JP)

(72) Inventors: Hiroki Noguchi, Yokohama (JP); Satoshi Takaya, Kawasaki (JP); Shinobu Fujita, Inagi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days. days.

(21) Appl. No.: 15/453,215

(22) Filed: Mar. 8, 2017

(65) Prior Publication Data
US 2017/0178706 A1    Jun. 22, 2017

Related U.S. Application Data

(63) Continuation of application No. PCT/JP2015/069035, filed on Jul. 1, 2015.

(30) Foreign Application Priority Data

Mar. 10, 2015    (JP) .................................. 2015-047183

(51) Int. Cl.
*G11C 13/00* (2006.01)
*G11C 11/16* (2006.01)

(52) U.S. Cl.
CPC ........ *G11C 11/1673* (2013.01); *G11C 11/161* (2013.01); *G11C 11/1675* (2013.01); *G11C 11/1695* (2013.01); *G11C 13/0069* (2013.01)

(58) Field of Classification Search
CPC ........... G11C 7/02; G11C 7/24; G11C 11/161; G11C 11/1675; G11C 11/1695;
(Continued)

(56) References Cited

U.S. PATENT DOCUMENTS

| 5,349,220 A | * | 9/1994 | Hong | ..................... | G11C 16/12 257/316 |
| 5,414,665 A | * | 5/1995 | Kodama | ................ | G11C 16/16 365/185.06 |

(Continued)

FOREIGN PATENT DOCUMENTS

| JP | 2001-338993 | 12/2001 |
| JP | 2005-85349 | 3/2005 |

(Continued)

OTHER PUBLICATIONS

International Search Report dated Aug. 4, 2015 in PCT/JP2015/069035 filed Jul. 1, 2015 (with English translation).

(Continued)

*Primary Examiner* — Tan T. Nguyen
(74) *Attorney, Agent, or Firm* — Oblon, McClelland, Maier & Neustadt, L.L.P.

(57) ABSTRACT

According to one embodiment, a nonvolatile semiconductor memory includes a semiconductor substrate, a first substrate area in the semiconductor substrate, a first cell unit in the first substrate area, the first cell unit including a first memory cell and a first transistor, and the first transistor having a control terminal connected to a first word line, using the first substrate area as a channel and supplying a read current or a write current to the first memory cell, and a substrate potential setting circuit setting the first substrate area to a first substrate potential when the read current is supplied to the first memory cell, and setting the first substrate area to a second substrate potential different from the first substrate potential when the write current is supplied to the first memory cell.

13 Claims, 22 Drawing Sheets

(58) Field of Classification Search
CPC ............ G11C 11/1673; G11C 13/0002; G11C 13/0021; G11C 13/004; G11C 13/0069
USPC .............. 365/158, 148, 163, 185.27, 189.09, 365/189.15, 189.16
See application file for complete search history.

(56) References Cited

U.S. PATENT DOCUMENTS

| | | | |
|---|---|---|---|
| 6,751,125 B2* | 6/2004 | Prinz | ................. G11C 16/3418 365/185.18 |
| 6,873,561 B2* | 3/2005 | Ooishi | .................... G11C 11/15 365/148 |
| 7,073,147 B2 | 7/2006 | Ikeda et al. | |
| 2001/0038552 A1 | 11/2001 | Ishimaru | |
| 2005/0068824 A1 | 3/2005 | Houmura et al. | |
| 2007/0280021 A1 | 12/2007 | Ueda et al. | |
| 2010/0118581 A1 | 5/2010 | Okayama | |
| 2010/0195376 A1 | 8/2010 | Yoon et al. | |
| 2010/0238707 A1 | 9/2010 | Tsuchida | |
| 2010/0265759 A1 | 10/2010 | Chung et al. | |
| 2010/0321982 A1 | 12/2010 | Takagi et al. | |
| 2014/0293685 A1 | 10/2014 | Noguchi et al. | |

FOREIGN PATENT DOCUMENTS

| | | |
|---|---|---|
| JP | 2007-323706 | 12/2007 |
| JP | 2008-269712 | 11/2008 |
| JP | 2010-118542 | 5/2010 |
| JP | 2010-218658 | 9/2010 |
| JP | 2014-191835 | 10/2014 |
| WO | WO 2010/047068 A1 | 4/2010 |
| WO | WO 2010/070895 A1 | 6/2010 |

OTHER PUBLICATIONS

Written Opinion dated Aug. 4, 2015 in PCT/JP2015/069035 filed Jul. 1, 2015.

* cited by examiner

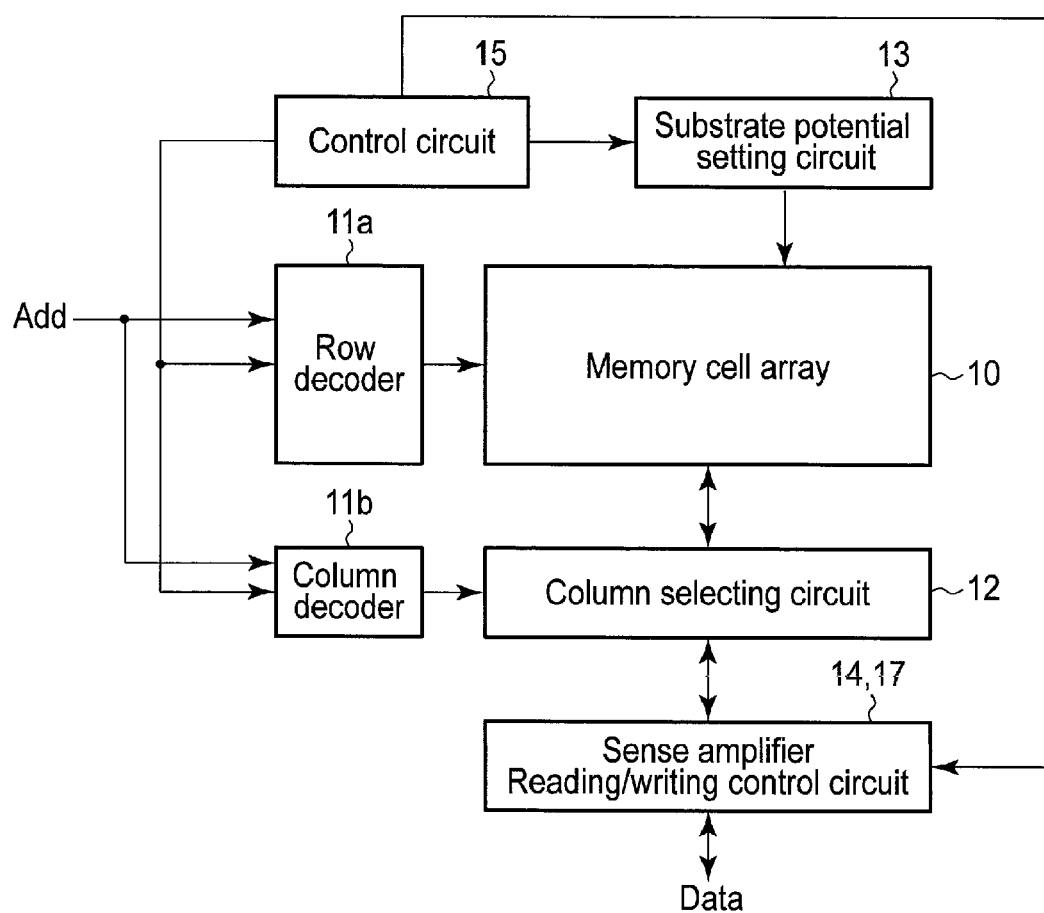
F I G. 1

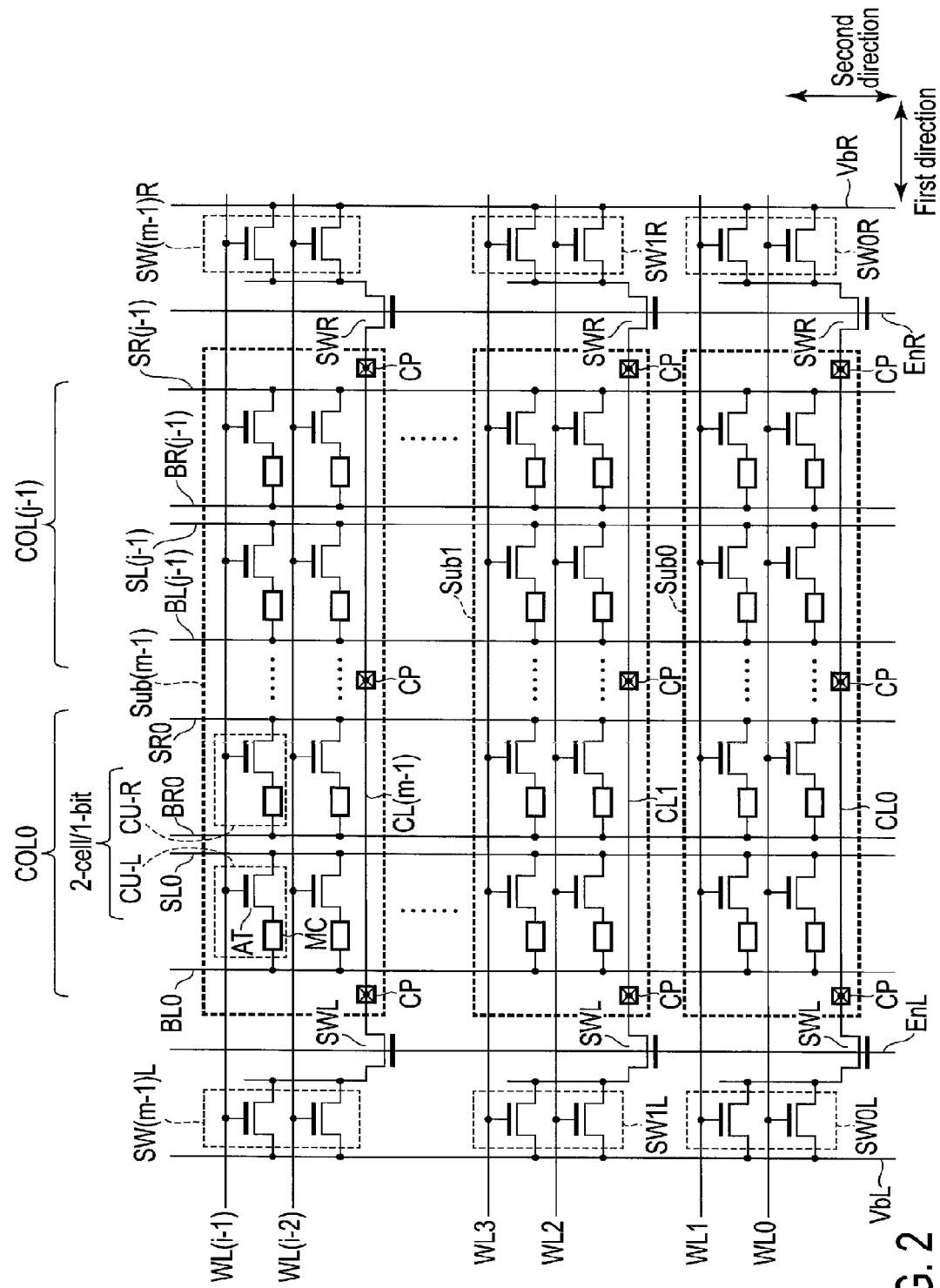
F I G. 2

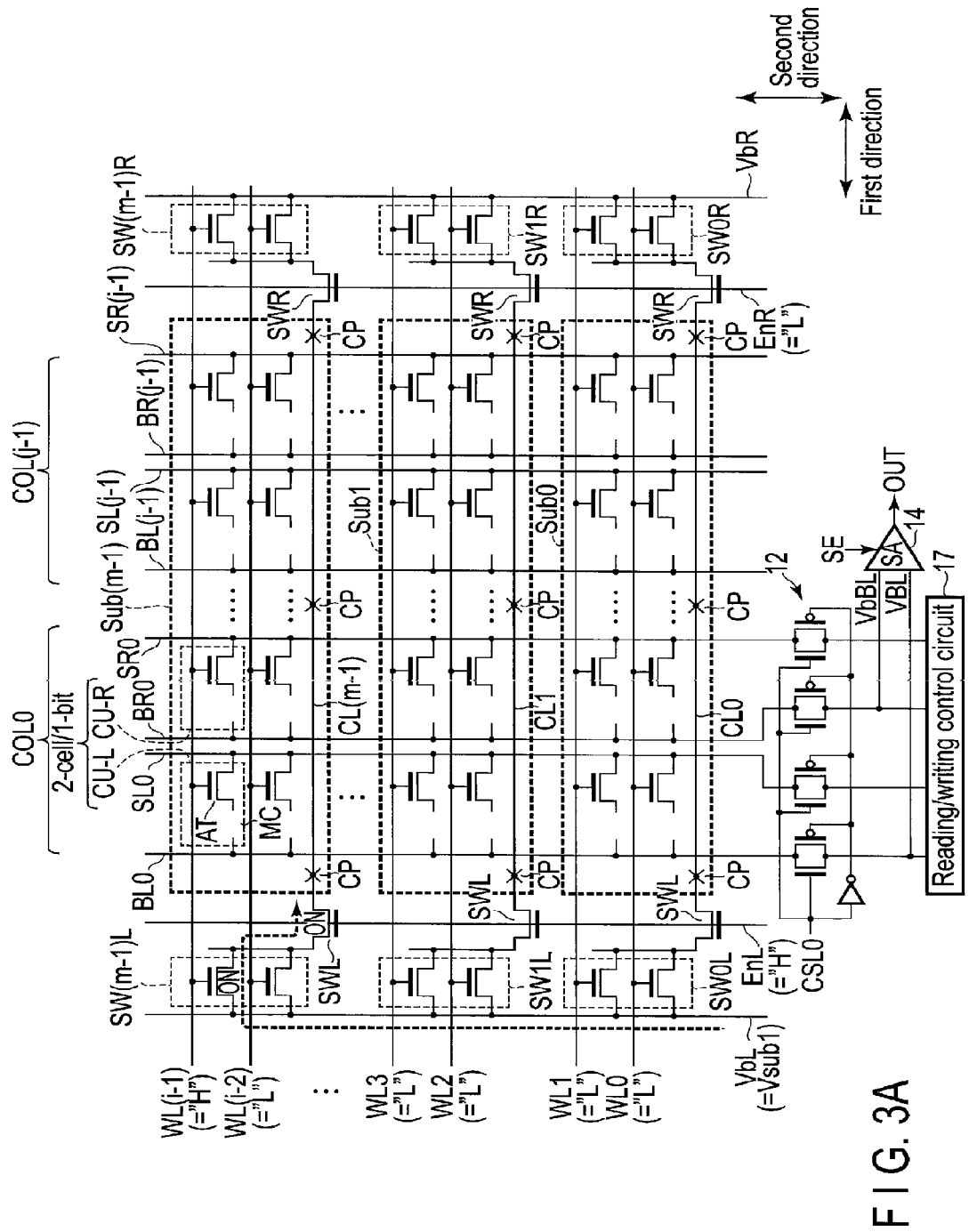
F I G. 3A

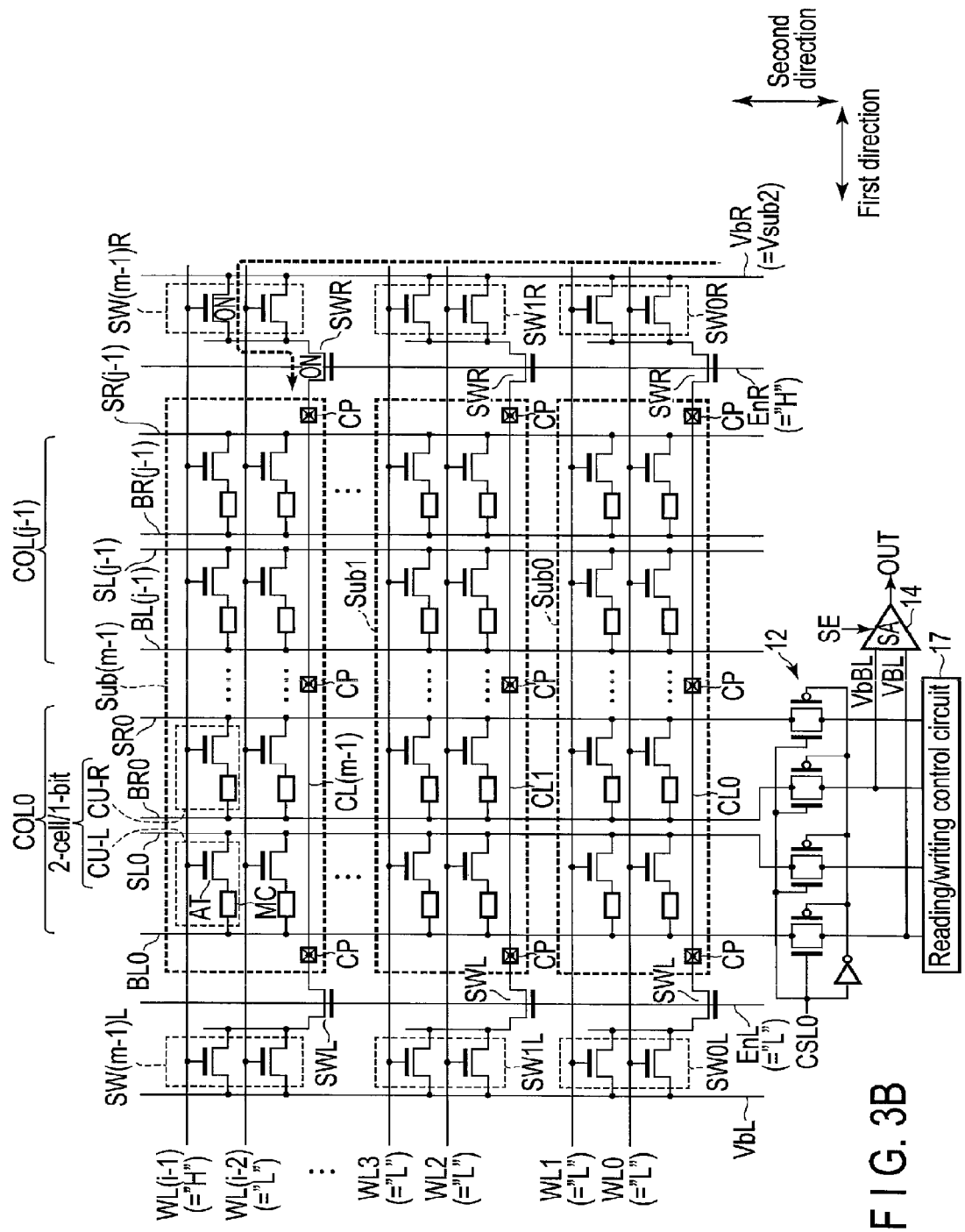
F I G. 3B

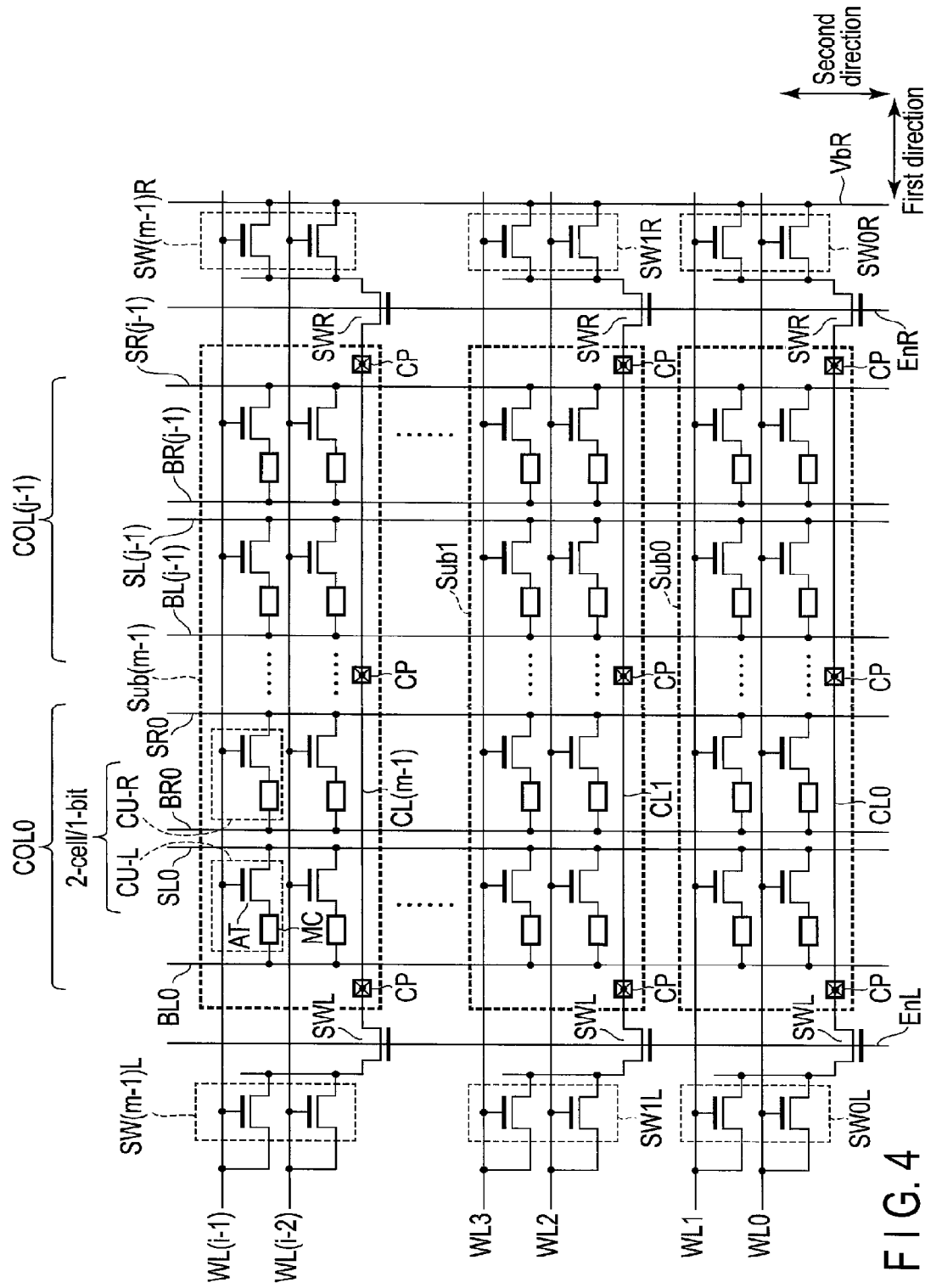
F I G. 4

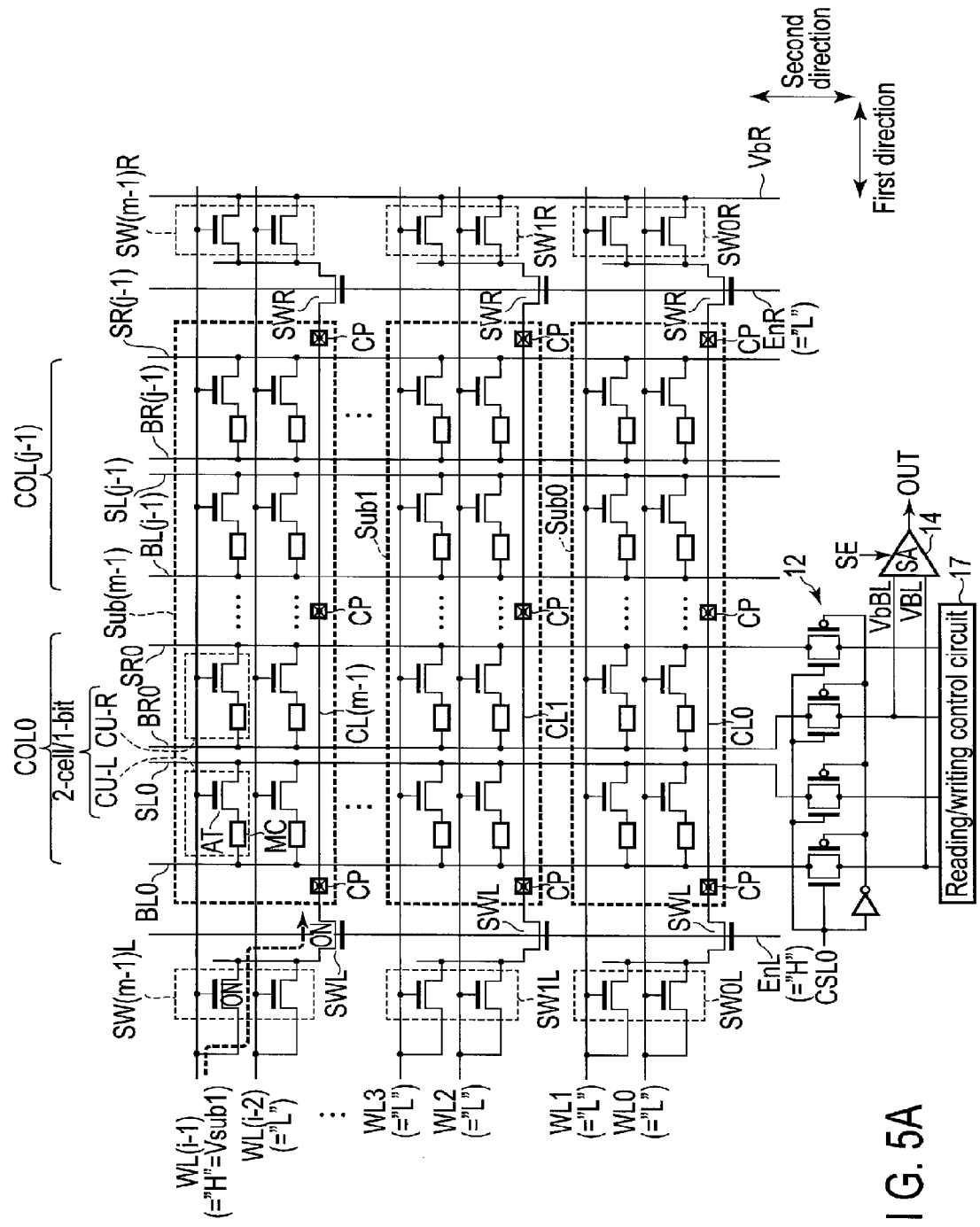
F I G. 5A

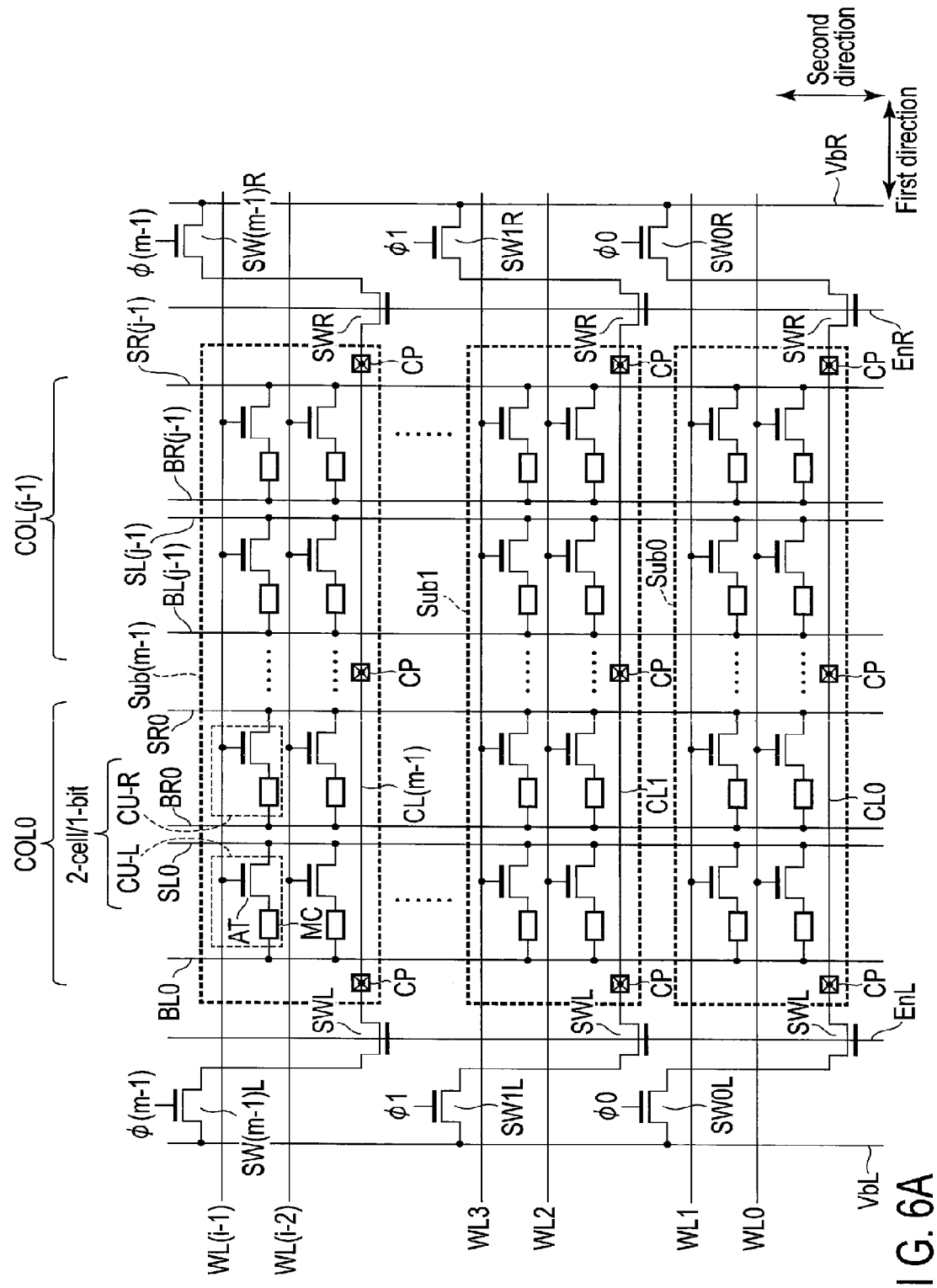
F I G. 6A

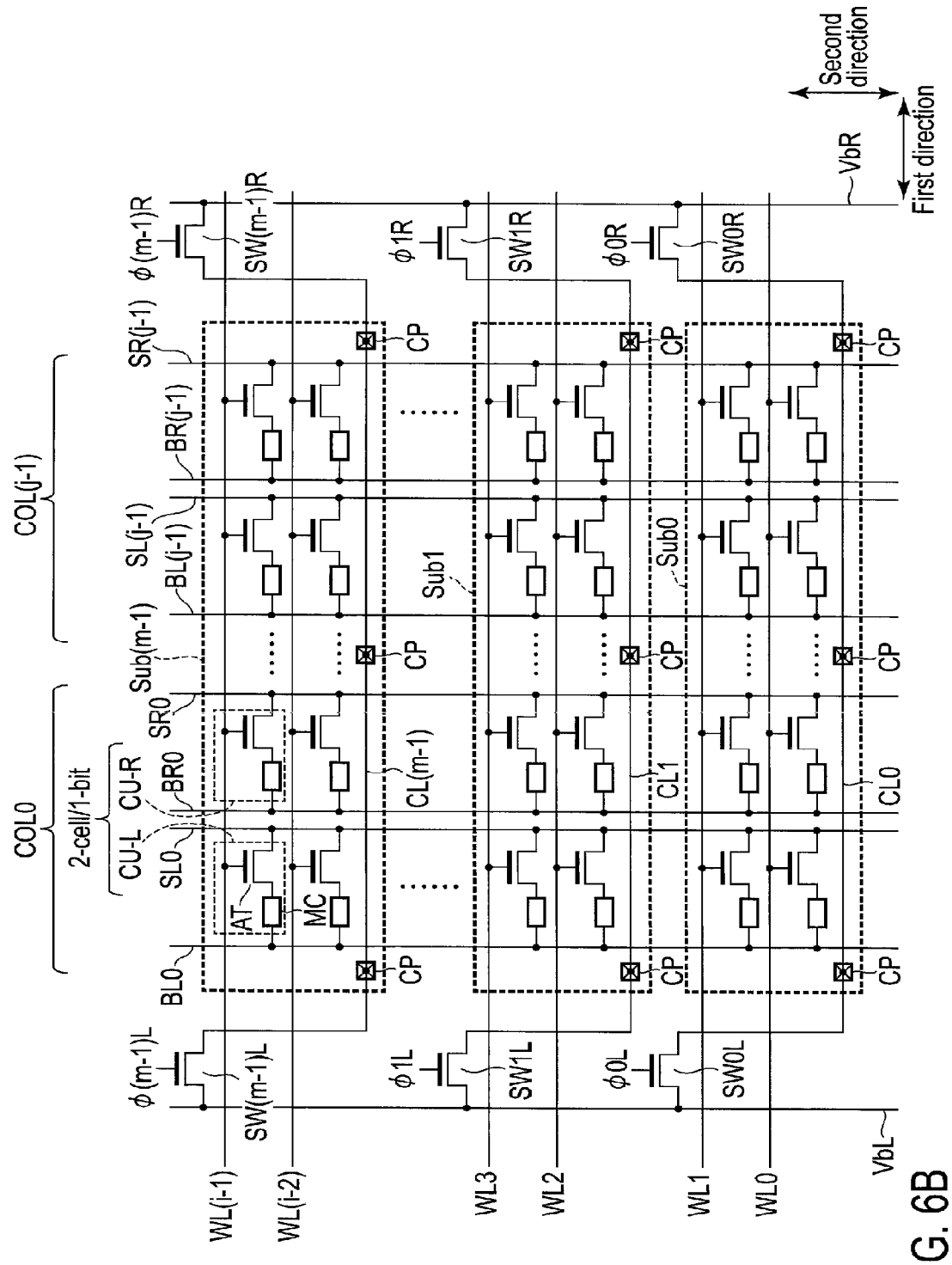
F I G. 6B

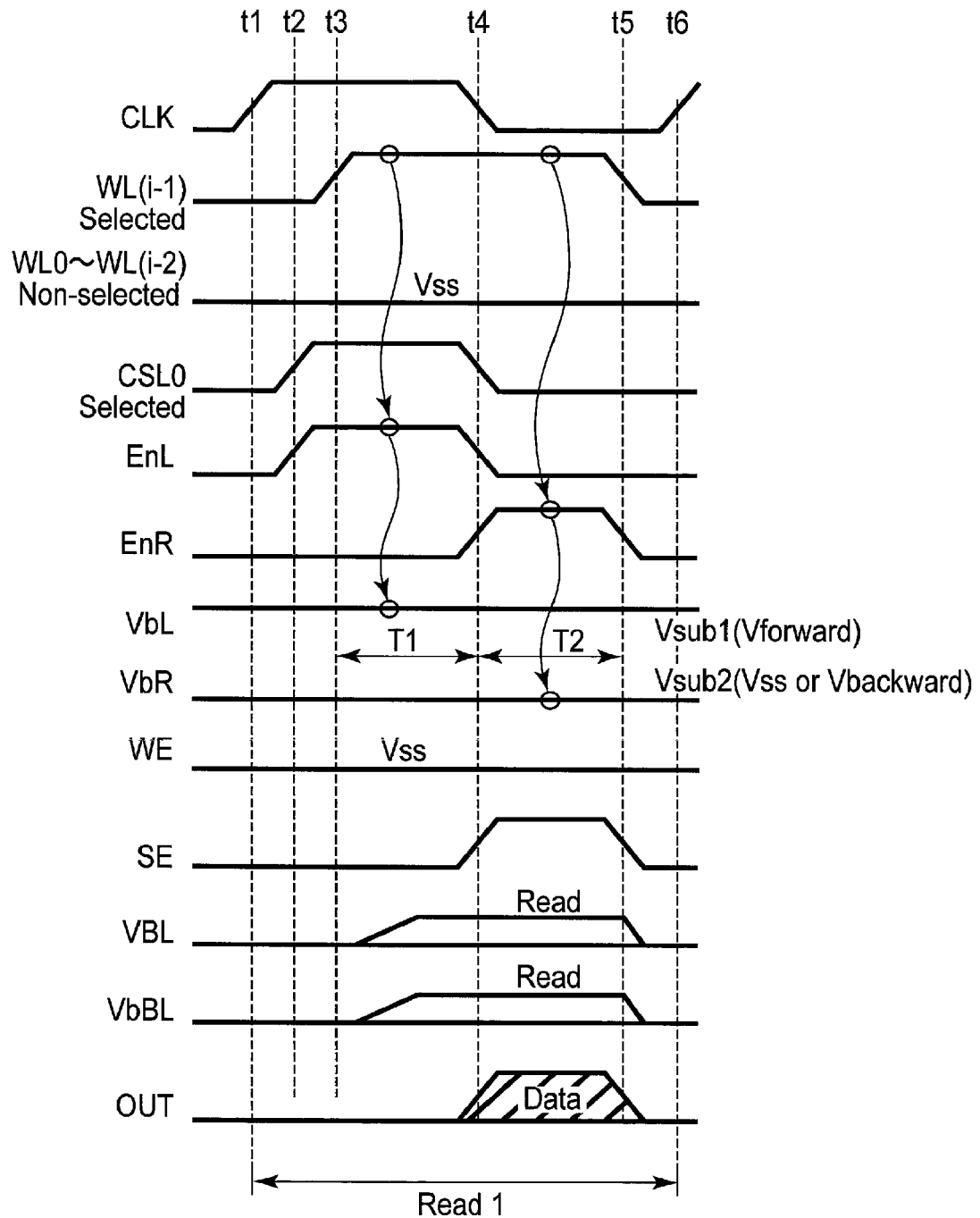
F I G. 8

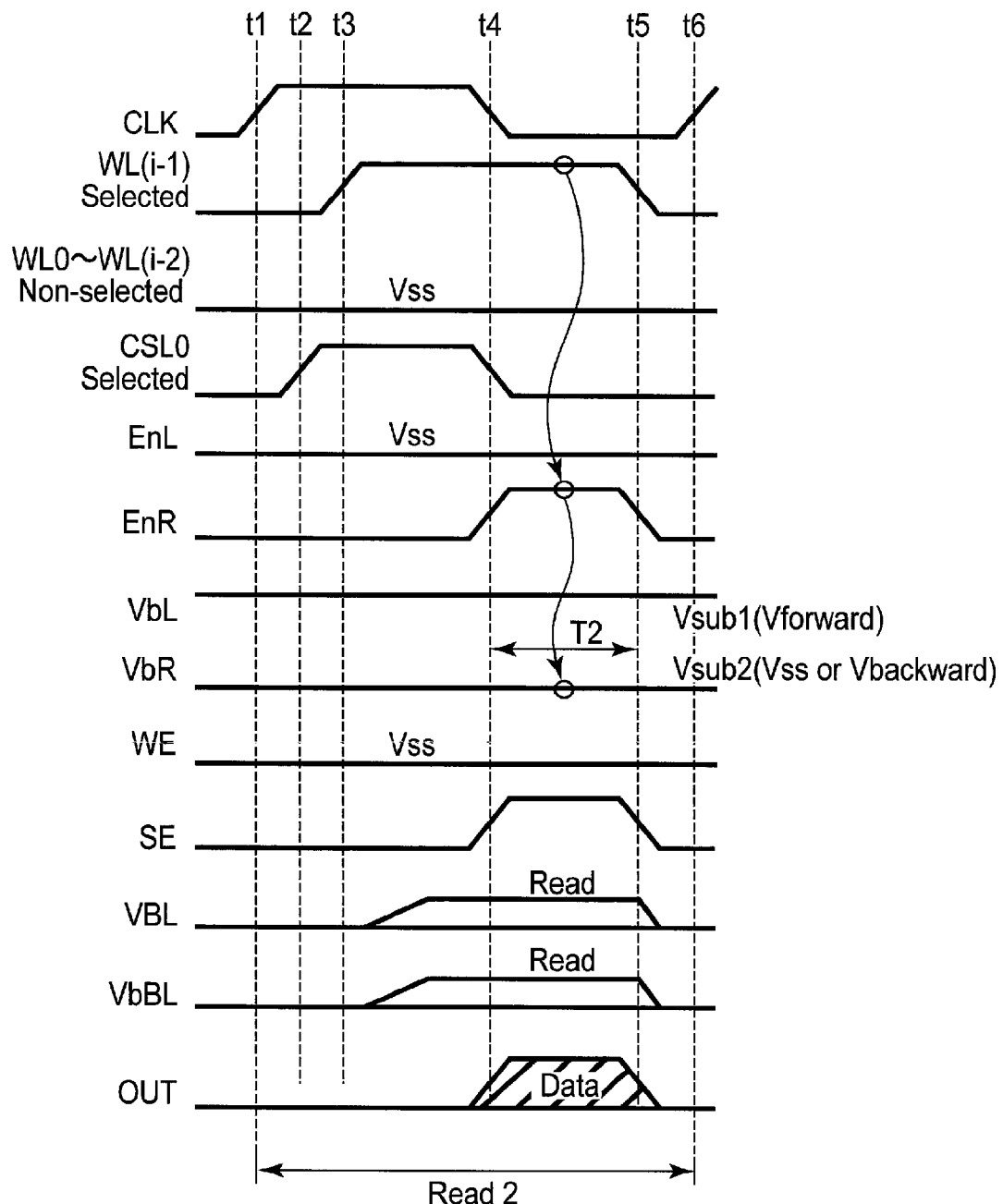
F I G. 9

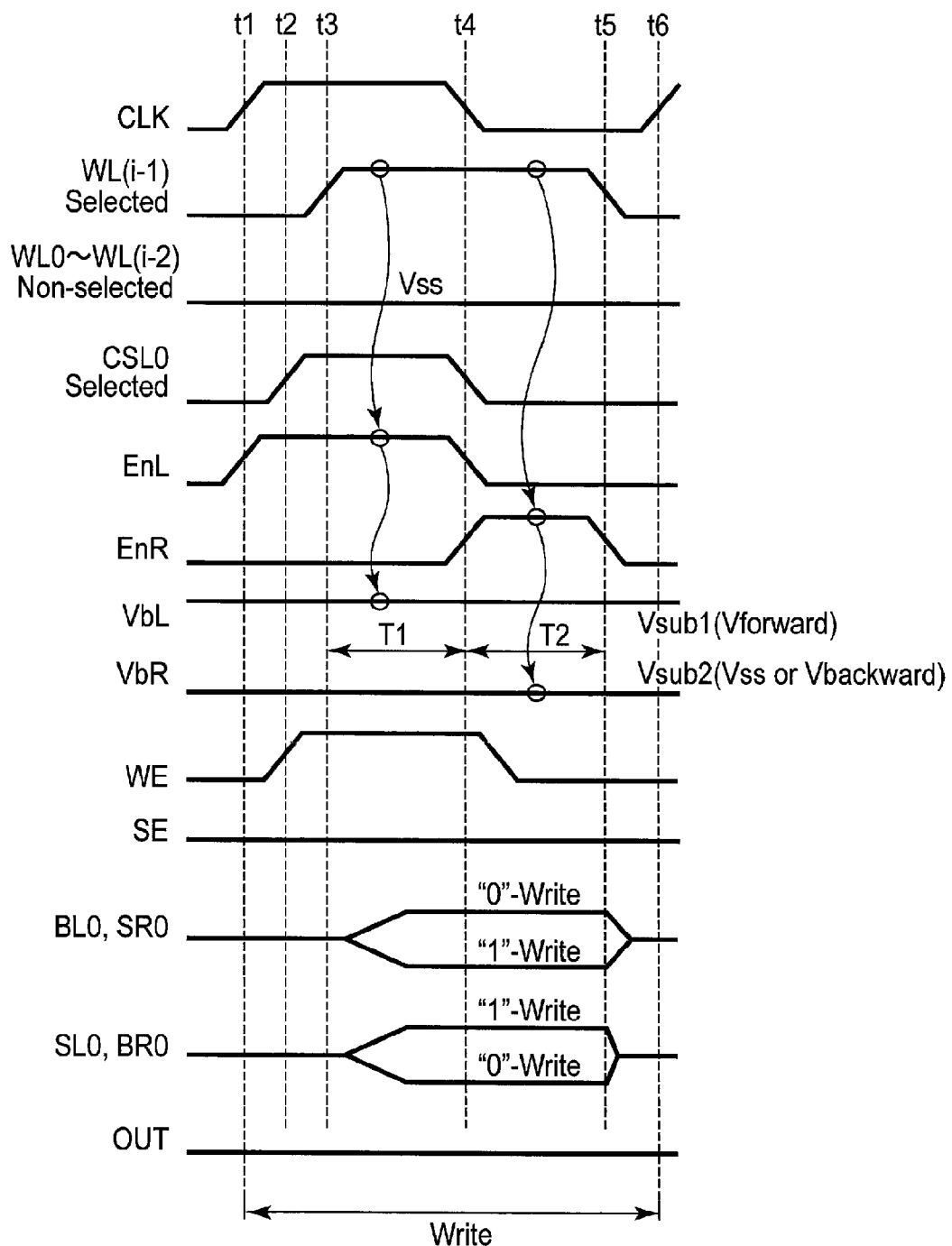
F I G. 10

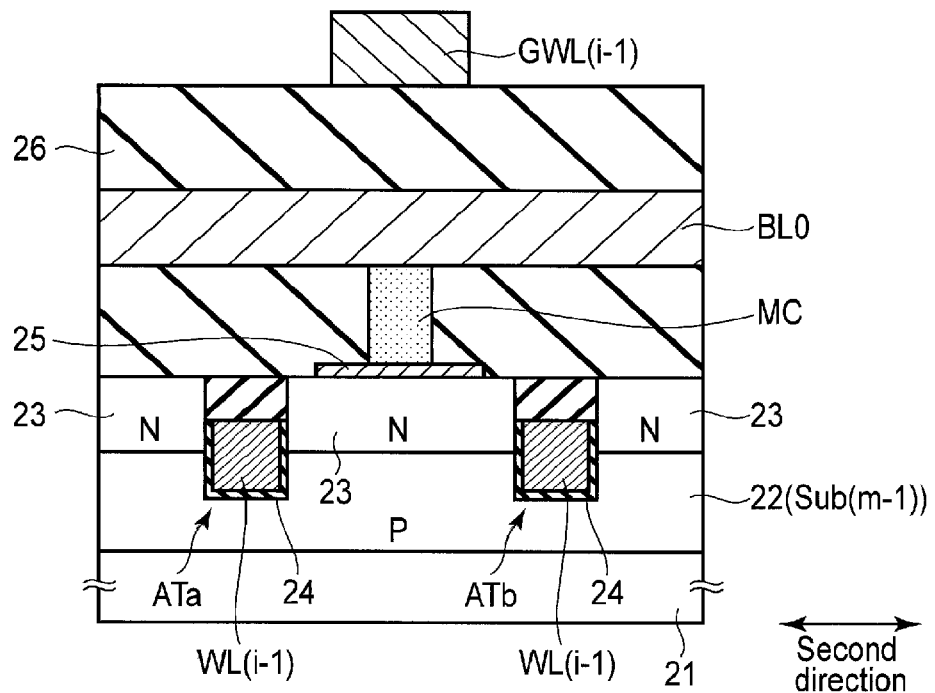
F I G. 13
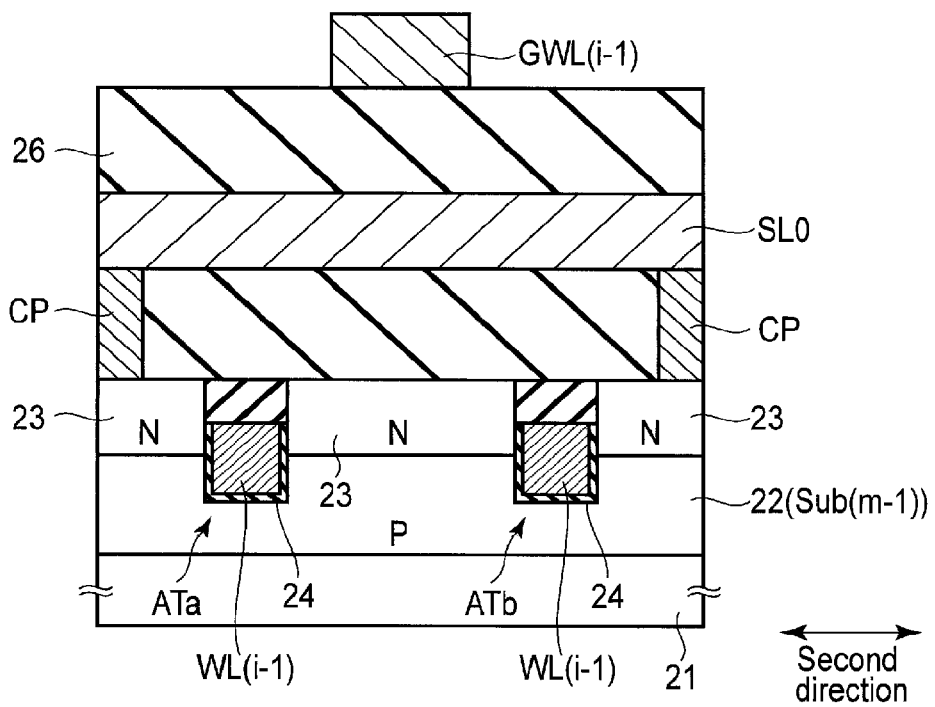
F I G. 14

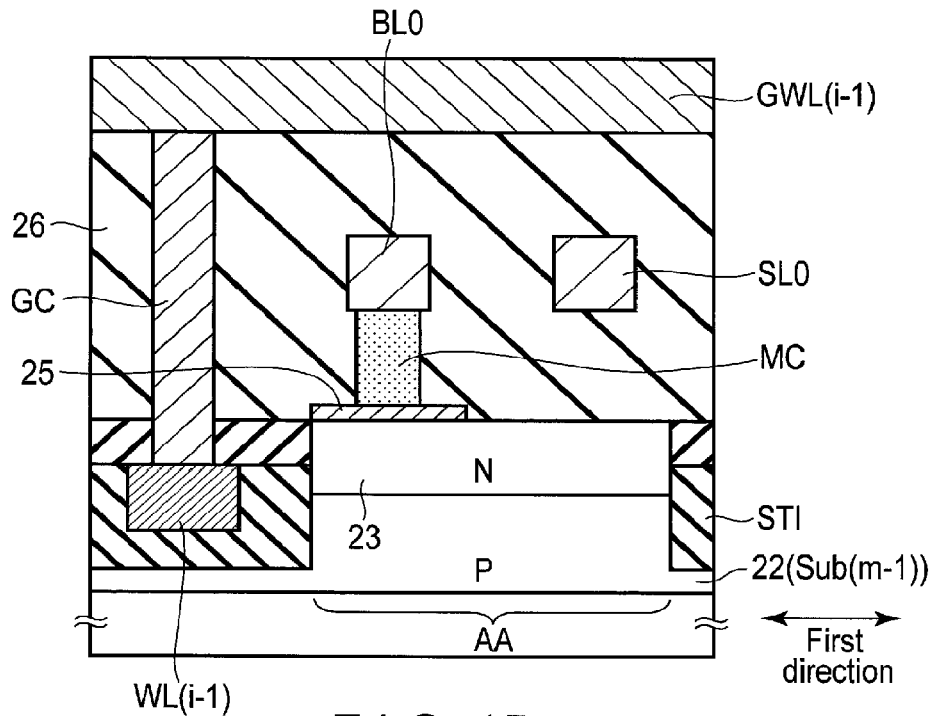
F I G. 15
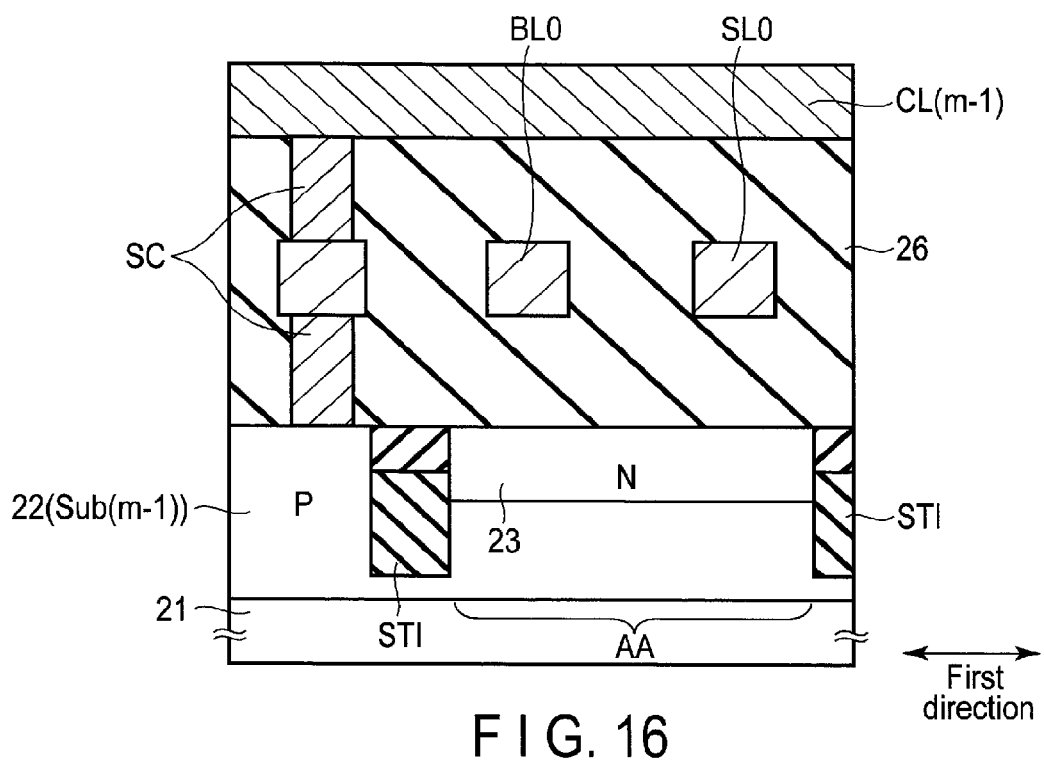
F I G. 16

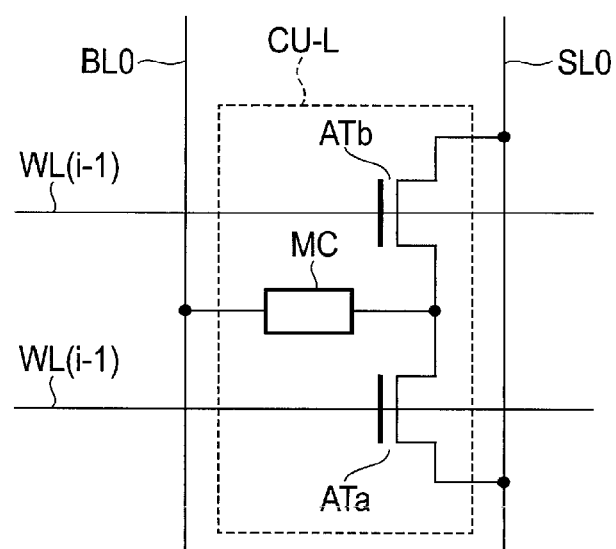
F I G. 17

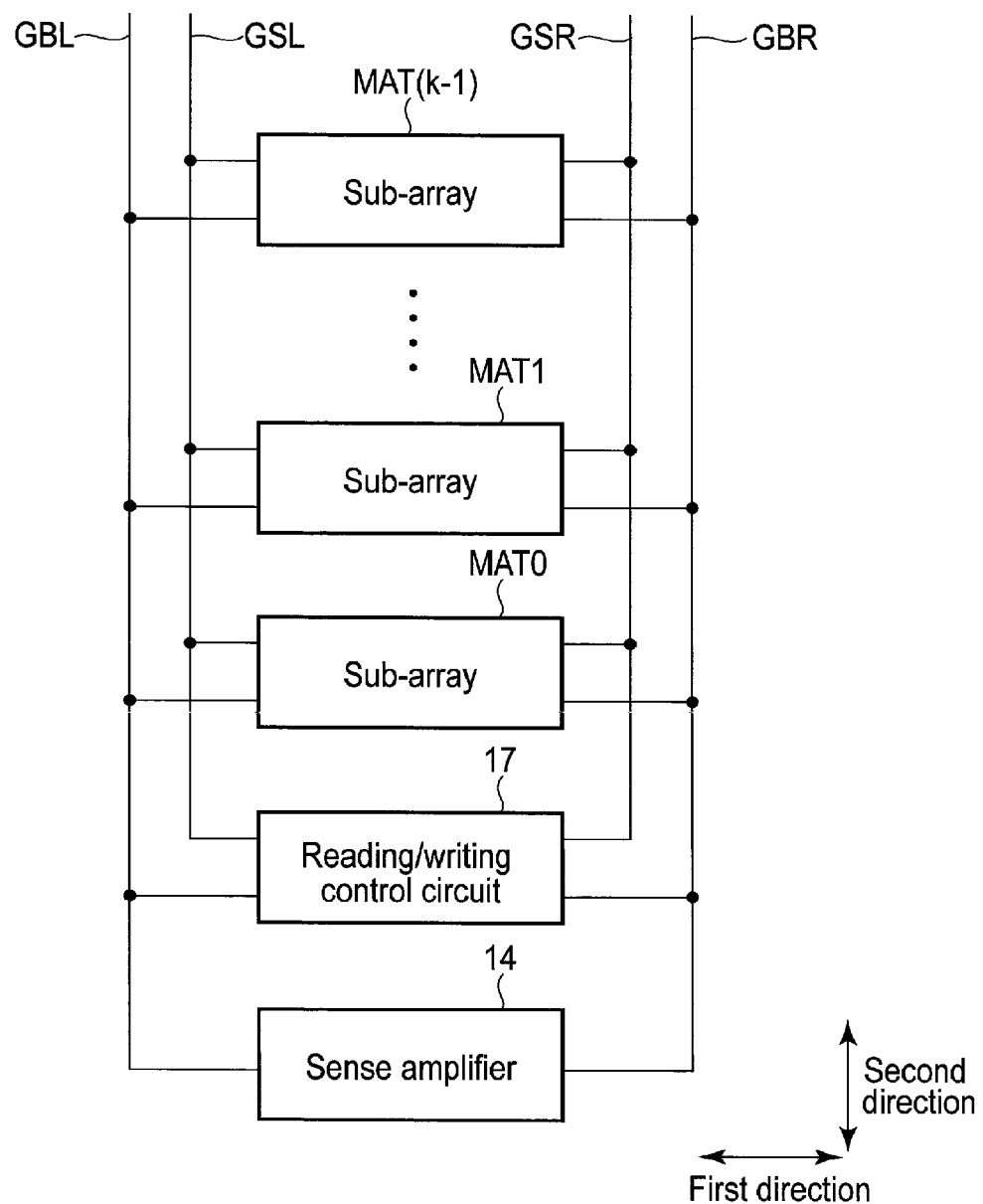
F I G. 18

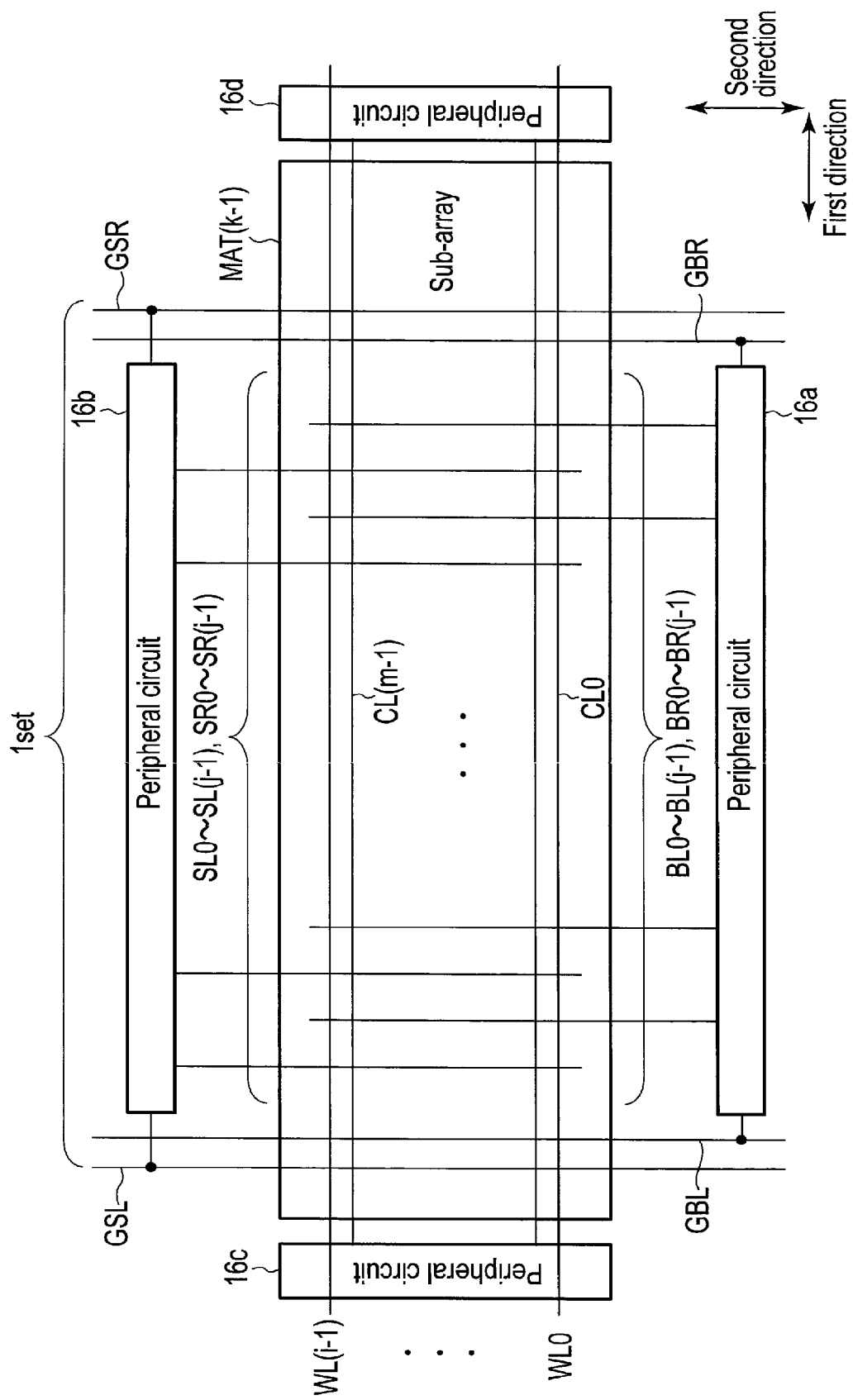
F I G. 19

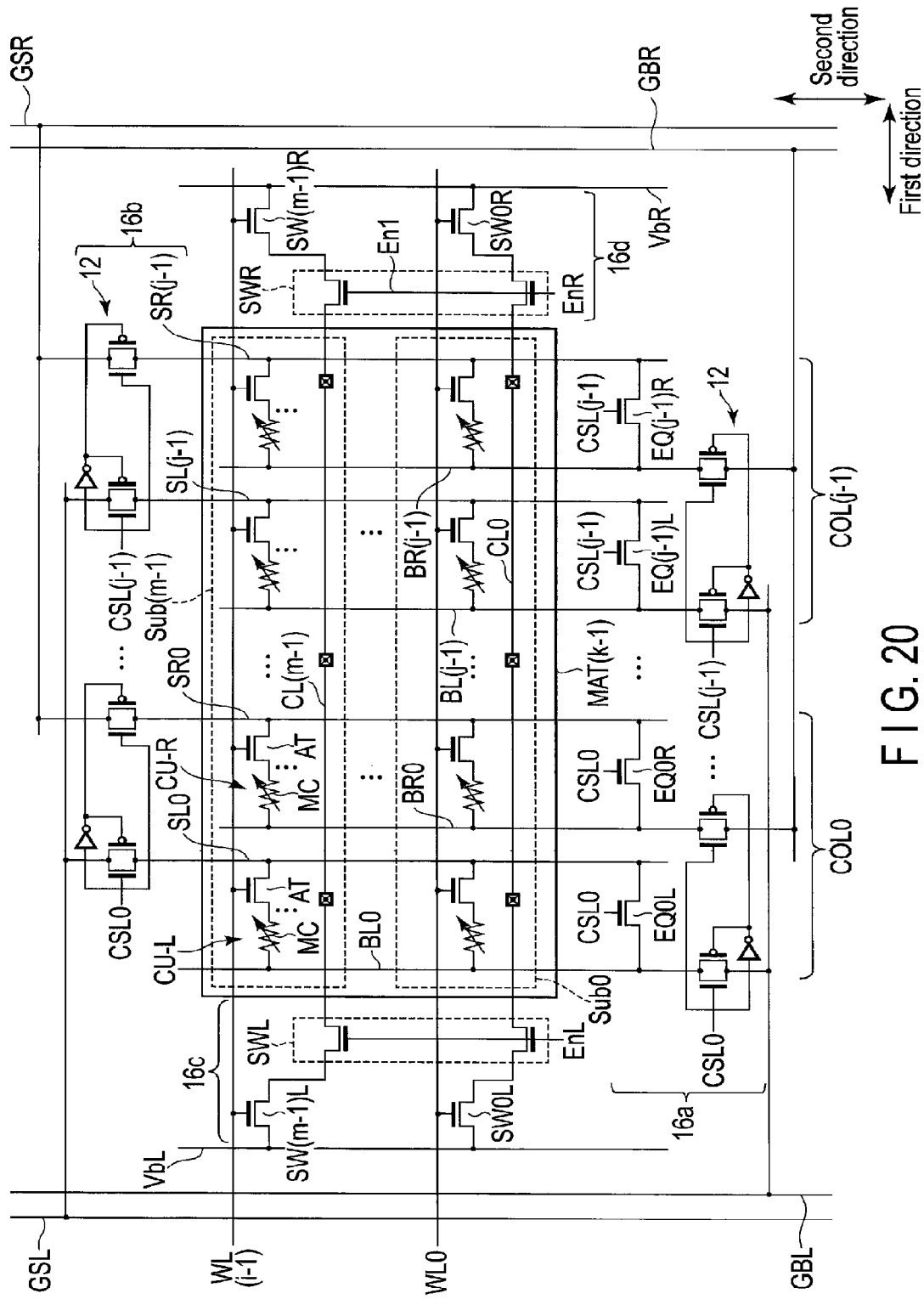
F I G. 20

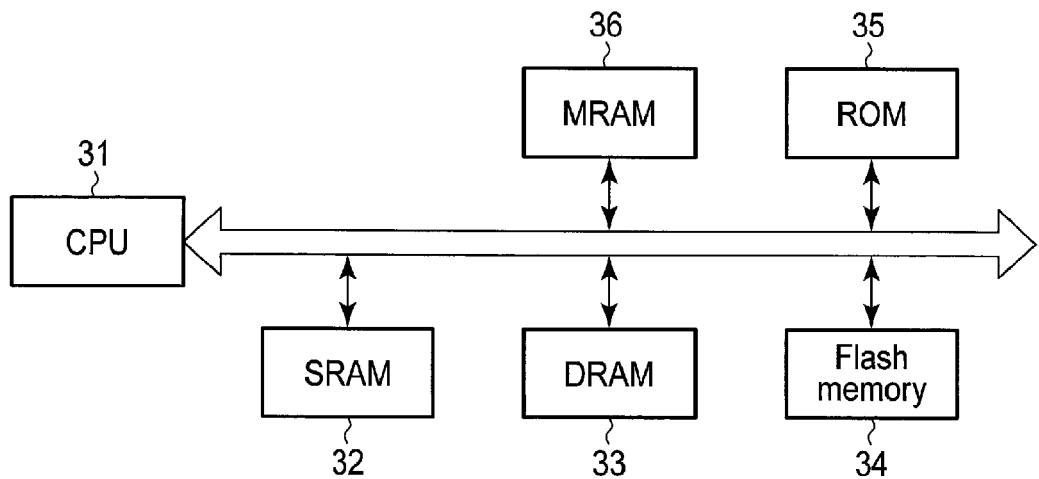
F I G. 21
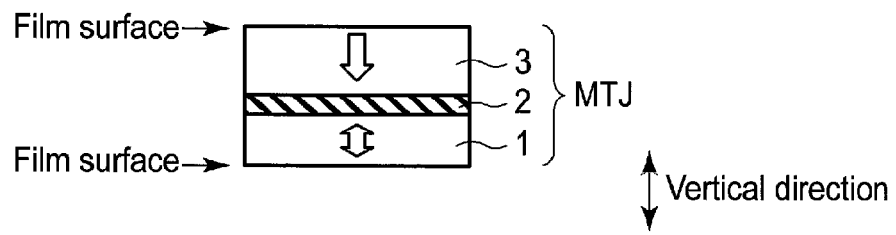
F I G. 22
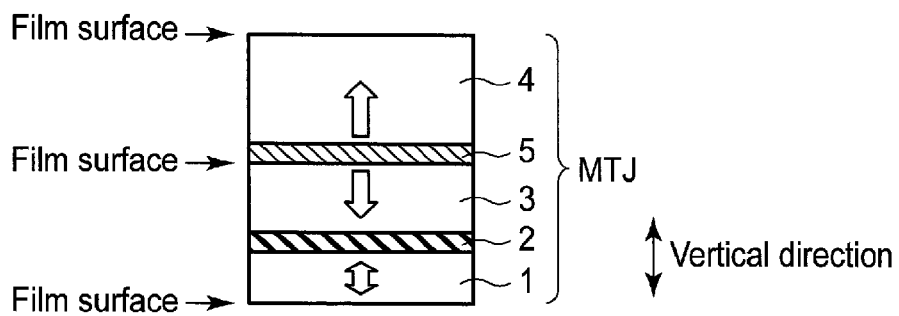
F I G. 23

NONVOLATILE SEMICONDUCTOR MEMORY

CROSS REFERENCE TO RELATED APPLICATIONS

This application is a Continuation Application of PCT Application No. PCT/JP2015/069035, filed Jul. 1, 2015 and based upon and claiming the benefit of priority from Japanese Patent Application No. 2015-047183, filed Mar. 10, 2015, the entire contents of which are incorporated herein by reference.

FIELD

Embodiments described herein relate generally to a nonvolatile semiconductor memory.

BACKGROUND

In nonvolatile semiconductor memories, a trade-off exists between write error and read disturb that is write error in reading.

For example, in a magnetic random access memory, which is one of the nonvolatile semiconductor memories, a write current tends to decrease according to improvement of the characteristic of a magnetoresistive element that acts as a memory cell. A read current needs to be smaller than the write current, but cannot be sufficiently reduced due to the need for achieving high-speed sensing. Under the circumstances, therefore, a current difference (margin) between the write current and the read current is small.

Meanwhile, the nonvolatile semiconductor memory in general has varied write characteristics in which memory cells in a memory cell array each have a different write current. However, the write current and the read current are supplied to a memory cell through a common access transistor (same path).

If, therefore, the access transistor is designed to supply a write current that enables correct writing in a memory cell having the worst write characteristic (having the largest write current), a read current would exceed a write threshold value in reading a memory cell having the best write characteristic (having the smallest write current). This may cause the erroneous writing.

In contrast, if the access transistor is designed in such a manner that the access transistor supplies a read current that prevents the read current from exceeding the write threshold value in reading a memory cell having the best write characteristic, the write current would not exceed the write threshold value in writing a memory cell having the worst write characteristic. This may cause the write error.

BRIEF DESCRIPTION OF THE DRAWINGS

FIG. 1 is an overall diagram of a resistive memory.

FIG. 2 is a circuit diagram illustrating a memory cell layout of a first embodiment.

FIG. 3A is a circuit diagram illustrating an example of setting a substrate potential in the layout of FIG. 2.

FIG. 3B is a circuit diagram illustrating an example of setting a substrate potential in the layout of FIG. 2.

FIG. 4 is a circuit diagram illustrating a memory cell layout of a second embodiment.

FIG. 5A is a circuit diagram illustrating an example of setting a substrate potential in the layout of FIG. 4.

FIG. 6A is a circuit diagram illustrating a memory cell layout of a third embodiment.

FIG. 6B is a circuit diagram illustrating a memory cell layout of the third embodiment.

FIG. 8 is a waveform diagram illustrating an example operational waveform in reading.

FIG. 9 is a waveform diagram illustrating an example operational waveform in reading.

FIG. 10 is a waveform diagram illustrating an example operational waveform in writing.

FIG. 13 is a cross-sectional view taken along line XIII-XIII of FIG. 12.

FIG. 14 is a cross-sectional view taken along line XIV-XIV of FIG. 12.

FIG. 15 is a cross-sectional view taken along line XV-XV of FIG. 12.

FIG. 16 is a cross-sectional view taken along line XVI-XVI of FIG. 12.

FIG. 17 is a circuit diagram illustrating an equivalent circuit of a cell unit CU-L in FIG. 12.

FIG. 18 is a block diagram illustrating an application example used in a memory cell array of a hierarchical bit line structure.

FIG. 19 is a block diagram illustrating an example of a sub-array and peripheral circuits thereof in FIG. 18.

FIG. 20 is a circuit diagram illustrating an example of sub-arrays and peripheral circuits thereof in FIG. 18.

FIG. 21 illustrates a nonvolatile cache system.

FIG. 22 illustrates an example magnetoresistive element.

FIG. 23 illustrates an example magnetoresistive element.

DETAILED DESCRIPTION

Figure 5B:
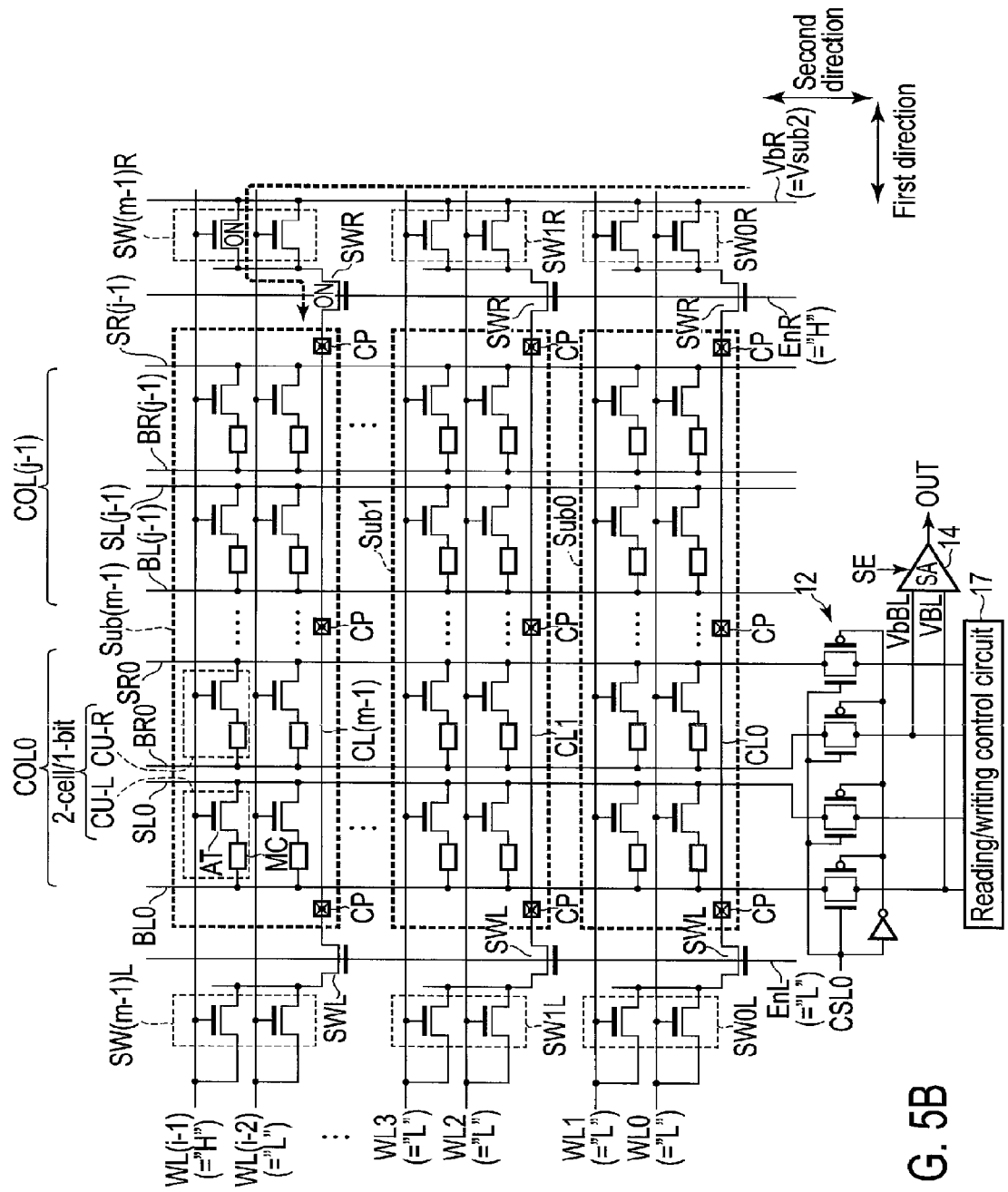
FIG. 5B is a circuit diagram illustrating an example of setting a substrate potential in the layout of FIG. 4.

In general, according to one embodiment, a nonvolatile semiconductor memory comprises: a semiconductor substrate; a first substrate area in the semiconductor substrate; a first cell unit in the first substrate area, the first cell unit including a first memory cell and a first transistor, and the first transistor having a control terminal connected to a first word line, using the first substrate area as a channel and supplying a read current or a write current to the first memory cell; and a substrate potential setting circuit setting the first substrate area to a first substrate potential when the read current is supplied to the first memory cell, and setting the first substrate area to a second substrate potential different from the first substrate potential when the write current is supplied to the first memory cell.

Embodiments will be described below by referring to the accompanying drawings.

Embodiments described below are used in a nonvolatile semiconductor memory in which a write current and a read current are supplied to a memory cell through the same path. For example, a nonvolatile semiconductor memory includes a memory cell array, and the memory cell array includes a plurality of cell units, with each cell unit having a memory cell and an access transistor connected in series.

The memory cell as used herein represents an element that stores data. For example, the memory cell comprises a resistance change element, such as a magnetoresistive element or a phase change element. The access transistor as used herein represents an element that selects one of a plurality of rows in the memory cell array. For example, the access transistor comprises a field effect transistor (FET) in which a gate is connected to a word line.

In such a nonvolatile semiconductor memory, the embodiments described below present a new device structure in which the memory cell array includes a plurality of electrically-isolated substrate areas (e.g., a plurality of well regions) and each substrate area includes a plurality of cell units.

In this case, a substrate potential (back-gate bias) of the access transistor can be set for each substrate area.

For example, the substrate potential of a substrate area (access region), which includes a plurality of access transistors, provided in a target row for read/write or connected to a selected word line, and the substrate potential of a substrate area (non-access region), which includes at least one non-selected row that is not a target row for read/write, can be set independently.

As a result, in writing, the substrate potential of the substrate area provided as the access region, or the write current that flows through the selected memory cells, can be adjusted so as to prevent occurrence of write error in selected memory cells, or to allow correct writing in the selected memory cells.

In reading, the substrate potential of the substrate area provided as the access region, or the read current that flows through selected memory cells, can be adjusted so as to execute reading without erroneous writing in the selected memory cells.

Further, in reading/writing, the substrate potential of the substrate area provided as the non-access region can be set so as not to generate a leak current in the non-selected memory cells. In standby, for example, other than reading/writing, the substrate potential of all substrate areas can be set to a value so as not to generate the leak current in all memory cells.

The following description of the embodiments will focus on providing different substrate potentials to the plurality of substrate areas in the memory cell array, or providing different substrate potentials to the access region and non-access region, between writing and reading. This is different from the technique of providing different substrate potentials between access time (selected time) and non-access time (non-selected time) to the plurality of substrate areas.

[Overall Structure]

FIG. 1 illustrates main components of a nonvolatile semiconductor memory.

A memory cell array 10 includes an array of a plurality of cell units. A row decoder 11a and a column decoder 11b randomly access the cell units in the memory cell array 10 in accordance with an address signal Add.

A column selecting circuit 12 has a role to electrically connect the memory cell array 10 to a sense amplifier 14 in accordance with a signal from the column decoder 11b.

A read/write control circuit 17 supplies a read current to a selected cell unit in the memory cell array 10 in reading. The sense amplifier 14 detects the read current to read data from a memory cell in the selected cell unit.

In writing, the read/write control circuit 17 supplies a write current to the selected cell unit in the memory cell array 10 to write data in a memory cell in the selected cell unit.

A substrate potential setting circuit 13 sets substrate potential in reading and writing. The substrate potential, as used herein, represents potential of a plurality of substrate areas in the semiconductor substrate.

A control circuit 15 controls operations of the row decoder 11a, the column decoder 11b, the substrate potential setting circuit 13, the sense amplifier 14, and the read/write control circuit 17.

First Embodiment

FIG. 2 illustrates a memory cell layout of a first embodiment.

There are m substrate areas Sub0, Sub1, . . . , Sub(m-1) disposed in the semiconductor substrate and electrically isolated from each other. m is a natural number equal to or larger than 2. For example, the m substrate areas Sub0, Sub1, . . . , Sub(m-1) are well regions. A device structure of the memory cell array will be described later.

The m substrate areas Sub0, Sub1, . . . , Sub(m-1) each include a plurality of cell units CU-L, CU-R. The cell units CU-L, CU-R each include a memory cell MC and an access transistor AT.

For example, the memory cell MC is a two-terminal element and is also a resistance change element that changes a resistance value by a write current (bidirectional current). The access transistor AT is, for example, an field effect transistor (FET) having a gate (control terminal), a source, and a drain, using one of the m substrate areas Sub0, Sub1, . . . , Sub(m-1) as a channel (current path).

The channel of the access transistor AT is series-connected to the memory cell MC. Specifically, the access transistor AT supplies a read current to the memory cell MC in reading, while supplying a write current to the memory cell MC in writing.

There are i word lines WL0, WL1, . . . , WL(i-2), WL(i-1), each extending in a first direction and connected to each gate of a plurality of access transistors ATs arranged in the first direction. i is a natural number equal to or larger than 2.

Each of the m substrate areas Sub0, Sub1, . . . , Sub(m-1) includes a plurality of cell units connected to a word line, or a plurality of cell units connected to a plurality of word lines. In the present embodiment, each of the m substrate areas Sub0, Sub1, . . . , Sub(m-1) includes a plurality of cell units connected to two word lines.

For example, the substrate area Sub0 includes a plurality of cell units CU-L, CU-R connected to two word lines WL0, WL1, respectively. The substrate area Sub1 includes a plurality of cell units CU-L, CU-R connected to two word lines WL2, WL3, respectively. The substrate area Sub(m-1) includes a plurality of cell units CU-L, CU-R connected to two word lines WL(i-2), WL(i-1), respectively.

In the present embodiment, m substrate areas Sub0, Sub1, . . . , Sub(m-1) are provided each corresponding to the same number of word lines, for example, two word lines. Alternatively, each substrate area may correspond to a different number of word lines.

There are j bit lines BL0, . . . , BL(j-1) each extending in the second direction crossing the first direction and connected to a first terminal of one of the plurality of cell units CU-L arranged in the second direction. There are j source lines SL0, . . . , SL(j-1) each extending in the second direction and connected to a second terminal of one of the plurality of cell units CU-L arranged in the second direction. j is a natural number equal to or larger than 2.

Similarly, j bit lines BR0, . . . , BR(j-1) each extend in the second direction and are connected to the first terminal of the plurality of cell units CU-R arranged in the second direction. Also, j source lines SR0, . . . SR(j-1) each extend in the second direction and are connected to the second terminal of the plurality of cell units CU-R arranged in the second direction.

The present embodiment illustrates a so-called 2-cell/1-bit type memory cell array that stores 1 bit by storing complimentary data in two cell units CU-L, CU-R.

In this case, each of j columns COL0, . . . , COL(j-1) includes two cell units CU-L, CU-R. The memory cell array is not limited to the one in the present embodiment. For example, the memory cell array may be a so-called 1-cell/1-bit type memory cell that stores 1 bit in 1 cell unit.

There are m substrate contact lines (m conductive wires) CL0, CL1, . . . , CL(m-1) provided corresponding to m substrate areas Sub0, Sub1, . . . , Sub(m-1) and extending in the first direction. The m substrate contact lines CL0, CL1, . . . , CL(m-1) are connected to the m substrate areas Sub0, Sub1, . . . , Sub(m-1) via contact plugs CPs.

First ends of the m substrate contact lines CL0, CL1, . . . , CL(m-1) are connected to a potential setting line (conductive wire) VbL via switching transistors SWL, SW0L, . . . , SW(m-1)L.

The switching transistors SWL, SW0L, . . . , SW(m-1)L are, for example, FETs each including a gate (control terminal), a source, and a drain.

The switching transistor SWL is turned on/off by a control signal EnL.

The switching transistors SW0L, . . . , SW(m-1)L are turned on/off in accordance with the potential of the i word lines WL0, WL1, . . . , WL(i-2), WL(i-1).

As used herein, the switching transistor SWxL being turned on means that at least one of the plurality of FETs in the switching transistor SWxL is turned on. The switching transistor SWxL being turned off means that all of the plurality of FETs in the switching transistor SWxL are turned off. x is a number from 0 to (m-1).

The switching transistor SW0L is provided for the substrate area Sub0. Thus, the switching transistor SW0L is turned on when one of the two word lines WL0, WL1 corresponding to the substrate area Sub0 is selected, or one of the two word lines WL0, WL1 is active (High-level).

The switching transistor SW(m-1)L is provided for the substrate area Sub(m-1). Thus, the switching transistor SW(m-1)L is turned on when one of the two word lines WL(i-2), WL(i-1) is selected corresponding to the substrate area Sub(m-1), or one of the two word lines WL(i-2), WL(i-1) is active (High-level).

Second ends of the m substrate contact lines CL0, CL1, . . . , CL(m-1) are connected to a potential setting line (conductive wire) VbR via switching transistors SWR, SW0R, . . . , SW(m-1)R.

The switching transistors SWR, SW0R, . . . , SW(m-1)R are, for example, FETs each having a gate (control terminal), a source, and a drain.

On-off of the switching transistors SWRs are controlled by a control signal EnR.

On-off of the switching transistor SW0R, SW(m-1)R is controlled in accordance with the potential of the i word lines WL0, WL1, . . . , WL(i-2), WL(i-1).

As used herein, the switching transistor SWxR being turned on means that at least one of the plurality of FETs in the switching transistor SWxR is turned on. The switching transistor SWxR being turned off indicates that all of the plurality of FETs in the switching transistor SWxR are turned off. x is a number from 0 to (m-1).

For example, the switching transistor SW0R is provided corresponding to the substrate area Sub0. If one of the two word lines WL0, WL1 that corresponds to the substrate area Sub0 is selected, or one of the two word lines WL0, WL1 is active (H-level), the switching transistor SW0R is turned on.

The switching transistor SW(m-1)R is provided for the substrate area Sub(m-1). Therefore, the switching transistor SW(m-1)R is turned on when one of the two word lines WL(i-2), WL(i-1) corresponding to the substrate area Sub(m-1) is selected, or when one of the two word lines WL(i-2), WL(i-1) is active (H-level).

It is noted that either the switching transistors SWL, SW0L, . . . SW(m-1)L and the potential setting line VbL connected to the first ends of the m substrate contact lines CL0, CL1, . . . , CL(m-1), or the switching transistors SWR, SW0R, . . . , SW(m-1)R and the potential setting line VbR connected to the second ends of the m substrate contact lines CL0, CL1, . . . , CL(m-1) may be omitted.

The memory cell array described above can, for example, independently set the substrate potential of the substrate area (access region), which is the target region for reading/writing, including the plurality of access transistors connected to the selected word line, and the substrate potential of the substrate area (non-access region), which is not the target region for reading/writing, including the plurality of access transistors connected to the non-selected one or more word lines.

If, therefore, the substrate potential of the non-access region is set to a potential that hardly allows the access transistor to be turned on, such as a negative potential when the access transistor is an N-channel FET, the occurrence of a leak current is prevented in the non-access region.

Specifically, a potential difference occurs between the bit lines and the source lines even in the non-selected cell units in reading/writing. This may cause the leak current to flow in the access transistor channel in the non-selected cell unit when the word line connected to the non-selected cell unit is non-active (Low-level), for example, at 0 V.

Preferably, therefore, the substrate potential of the substrate area (non-access region) in which the non-selected cell units are disposed is set to a potential that allows backward bias of the source (N-type) of the access transistor and the substrate area (P-type). This is because the access transistors in the non-access region can be completely turned off and the occurrence of the leak current can be prevented in the non-access region.

In the access region, a sufficient current difference (margin) between the read current and the write current can be obtained by changing the substrate potential between reading and writing.

In writing, for example, the substrate potential of the access region is set so as not to generate the write error in the selected cell unit, or to execute writing correctly in the selected memory cell. In reading, the substrate potential of the access region is set so as to execute the reading without the erroneous writing in the selected memory cell.

When the access transistor is the N-channel FET, the substrate potential of the access region is preferably set to a potential that allows forward bias of the source (N-type) of the access transistor and the substrate area (P-type) in reading/writing.

For the similar reason, when the access transistor is the P-channel FET, the substrate potential of the non-access region is preferably set to a potential that allows backward bias of the source (P-type) of the access transistor and the substrate area (N-type), or the positive potential. The substrate potential of the access region is preferably set in reading/writing to a potential that allows forward bias of the source (P-type) of the access transistor and the substrate area (N-type), or the negative potential.

Meanwhile, the absolute value of the substrate potential of the access region is preferably larger in writing than in reading, in order to increase the margin between the read current and the write current.

Further, to decrease the leak current in reading/writing, the number of word lines corresponding to the substrate area is preferably minimized. This is because the leak current may occur in the cell units connected to the non-selected word lines in the substrate area (access region) including the selected word line.

When the number of substrate areas increases in the memory cell array, more areas are needed for electrically isolating the substrate areas. This results in the increase in size of the memory cell array. Preferably, therefore, the number of the substrate areas would be determined by adjusting the decrease of the leak current and the size of the memory cell array.

FIGS. 3A and 3B illustrate examples of setting the substrate potential in the layout of FIG. 2.

A column selecting circuit 12 is a transfer gate including a P-channel FET and an N-channel FET, corresponding to the column selecting circuit 12 in FIG. 1. A sense amplifier 14 and a read/write control circuit 17 correspond to the sense amplifier 14 and the read/write control circuit 17 in FIG. 1.

The column selecting circuit 12 sets a column select signal CSL0 to the High level when selecting the column COL0. One column is selected in the present embodiment, but a plurality of columns may be selected simultaneously. In that case, the number of sense amplifiers 14 is preferably equal to the number of columns to be selected.

In reading, the read/write control circuit 17 connects the bit lines BL0, BR0 to the sense amplifier 14 and sets the source lines SL0, SR0 to the ground potential.

In reading, the potential of the bit lines BL0, BR0 is determined as the read current flows in the two cell units CU-L, CU-R that are connected to the selected word line WL(i-1). The potential of the bit line BL0 is VBL which is input to the sense amplifier 14. The potential of the bit line BR0 is VbBL which is input to the sense amplifier 14.

The sense amplifier 14 is activated and enabled when an activate signal SE is at High level.

In writing, the read/write control circuit 17 sets one of the bit line BL0 and the source line SL0 to the High level, while setting the other of the bit line BL0 and the source line SL0 to the Low level. The potential relationship (direction of the write current) between the bit line BL0 and the source line SL0 is determined according to the write data.

Similarly, the read/write control circuit 17 sets one of the bit line BR0 and the source line SR0 to the High level, while setting the other of the bit line BR0 and the source line SR0 to the Low level. The potential relationship (direction of the write current) of the bit line BR0 and the source line SR0 is determined according to the write data.

One of the two bit lines BL0, BR0 is set to the High level and the other of the two bit lines BL0, BR0 is set to the Low level in order to write complimentary data in the two cell units CU-L, CU-R connected to the selected word line WL(i-1).

When the word line WL(i-1) is selected, the potential of the word line WL(i-1) is at the High level and the switching transistors SW(m-1)L, SW(m-1)R are turned on.

In this case, as illustrated in FIG. 3A, the switching transistor SWL is turned on when the control signal EnL is at the High level.

When the word line WL(i-1) is selected and the control signal EnL is at the High level, the potential Vsub1 of the potential setting line VbL is applied, as the substrate potential, to the substrate area Sub(m-1), which is the access region, via the switching transistors SW(m-1)L, SWL in reading/writing.

Meanwhile, as illustrated in FIG. 3B, the switching transistor SWR is turned on when the control signal EnR is at the High level.

When the word line WL(i-1) is selected and the control signal EnR is at the High level, the potential Vsub2 of the potential setting line VbR is applied, as the substrate potential, to the substrate area Sub(m-1), which is the access region, via the switching transistors SW(m-1)R, SWR.

The switching transistors SW0L, . . . , SW(m-2)L, SW0R, . . . , SW(m-2)R are turned off, because the potential on the non-selected word lines WL0, WL1, . . . , WL(i-2) other than the word line WL(i-1) is at the Low level.

Accordingly, the substrate areas Sub0, Sub1, . . . , Sub(m-2), which are non-access regions, are floating. Applying predetermined potential (e.g., negative potential) in advance to all substrate areas Sub0, Sub1, . . . , Sub(m-1) allows the substrate areas Sub0, Sub1, . . . , Sub(m-2), which are non-access regions, to have the predetermined potential and become floating in reading/writing.

Vsub1 and Vsub2 may be selected from the plurality of potential values. In this case, for example, the substrate potential of the access region is set to Vsub1(=Vx) from the potential setting line VbL in reading, while the substrate potential of the access region is set to Vsub1(=Vy) from the potential setting line VbL in writing, thus allowing the substrate potential of the substrate area other than the reading/writing to be set to Vsub2(=Vz) from the potential setting line VbR. Vx≠Vy*Vz.

Second Embodiment

A second embodiment is a modification of the first embodiment. In the second embodiment, the same reference signs are given to constituent components similar to those in the first embodiment and such constituent components will not be described again in detail.

FIG. 4 illustrates a memory cell layout of the second embodiment.

The second embodiment differs from the first embodiment in connecting switching transistors SW0L, . . . , SW(m-1)L.

Specifically, the switching transistors SW0L, . . . , SW(m-1)L each have one of source and drain connected to each of substrate contact lines CL0, CL1, . . . , CL(m-1) via a switching transistor SWL, while the switching transistors SW0L, . . . , SW(m-1)L each have the other of source and drain connected to each of word lines WL0, WL1, . . . , WL(i-2), WL(i-1).

In the present embodiment, the potential of the selected word line is applied as the substrate potential to an access region (selected substrate area). For example, if the word line WL(i-1) is selected, the potential of the word line WL(i-1) is applied to the substrate area Sub(m-1) that is the access region.

An effect similar to the effect of the first embodiment can be obtained. Besides, a simple wiring design can be achieved, because the potential setting line VbL in FIG. 2 (first embodiment) is eliminated. Since the potential of word lines is used as the substrate potential, generation of new substrate potential is not needed and the potential charged in the word line is shared with the substrate, thus contributing to low power consumption.

However, the potential of the word line equals the substrate potential, and the substrate potential supplied from the switching transistors SWL, SW0L, . . . , SW(m-1)L would be at the High level if the selected word line is at the High level.

FIGS. 5A and 5B illustrate examples of setting the substrate potential in the layout of FIG. 4.

When the word line WL(i-1) is selected, the potential of the word line WL(i-1) is at the High level and the switching transistors SW(m-1)L, SW(m-1)R are turned on.

In this state, as illustrated in FIG. 5A, the switching transistor SWL is turned on if the control signal EnL is at the High level.

Accordingly, the potential Vsub1 of the word line WL(i-1) is applied as the substrate potential in reading/writing to the substrate area Sub(m-1), which is the access region, via the switching transistors SW(m-1)L, SWL, when the word line WL(i-1) is selected and the control signal EnL is at the High level.

Meanwhile, as illustrated in FIG. 5B, the switching transistor SWR is turned on when the control signal EnR is at the High level.

When the word line WL(i-1) is selected and the control signal EnR is at the High level, the potential Vsub2 of the potential setting line VbR is applied, as the substrate potential, to the substrate area Sub(m-1), which is the access region, via the switching transistors SW(m-1)R, SWR.

Third Embodiment

A third embodiment is a modification of the first embodiment. In the third embodiment, the same reference signs are given to constituent components similar to those in the first embodiment and such constituent components will not be described again in detail.

FIGS. 6A and 6B illustrate a memory cell layout of the third embodiment.

The third embodiment differs from the first embodiment in connecting switching transistors SW0L, . . . , SW(m-1)L, SW0R, . . . , SW(m-1)R. Specifically, the control terminals (gates) of the switching transistors SW0L, . . . , SW(m-1)L, SW0R, . . . , SW(m-1)R are not connected to the word lines WL0, WL1, . . . , WL(i-2), WL(i-1).

In the example of FIG. 6A, for example, the switching transistors SW0L, . . . , SW(m-1)L, SW0R, . . . , SW(m-1)R are controlled to be turned on/off by control signals φ0, φ1, . . . , φ(m-1).

In the example of FIG. 6B, the switching transistors SW0L, . . . , SW(m-1)L are controlled to be turned on/off by the control signals φ0L, φ1L, . . . , φ(m-1)L, while the switch transistors SW0R, . . . , SW(m-1)R are controlled to be turned on/off by the control signals φ0R, φ1R, . . . , φ(m-1)R.

The present embodiment can decrease the number of the switching transistors SW0L, . . . , SW(m-1)L, SW0R, . . . , SW(m-1)R (the number of FETs in a switching transistor) compared to the first and second embodiments.

The switching transistors SWL, SWR in FIG. 2 (first embodiment) can be eliminated in the example of FIG. 6B.

Thus, the present embodiment can further reduce the size of the memory cell, in addition to achieving an effect similar to the effect of the first embodiment.

Fourth Embodiment

A fourth embodiment is an application example of the first to third embodiments. In the fourth embodiment, the same reference signs are given to constituent components similar to those in the first to third embodiments and such constituent components will not be described again in detail. An application example in which the present embodiment is used in the first embodiment is described below.

Figure 7:
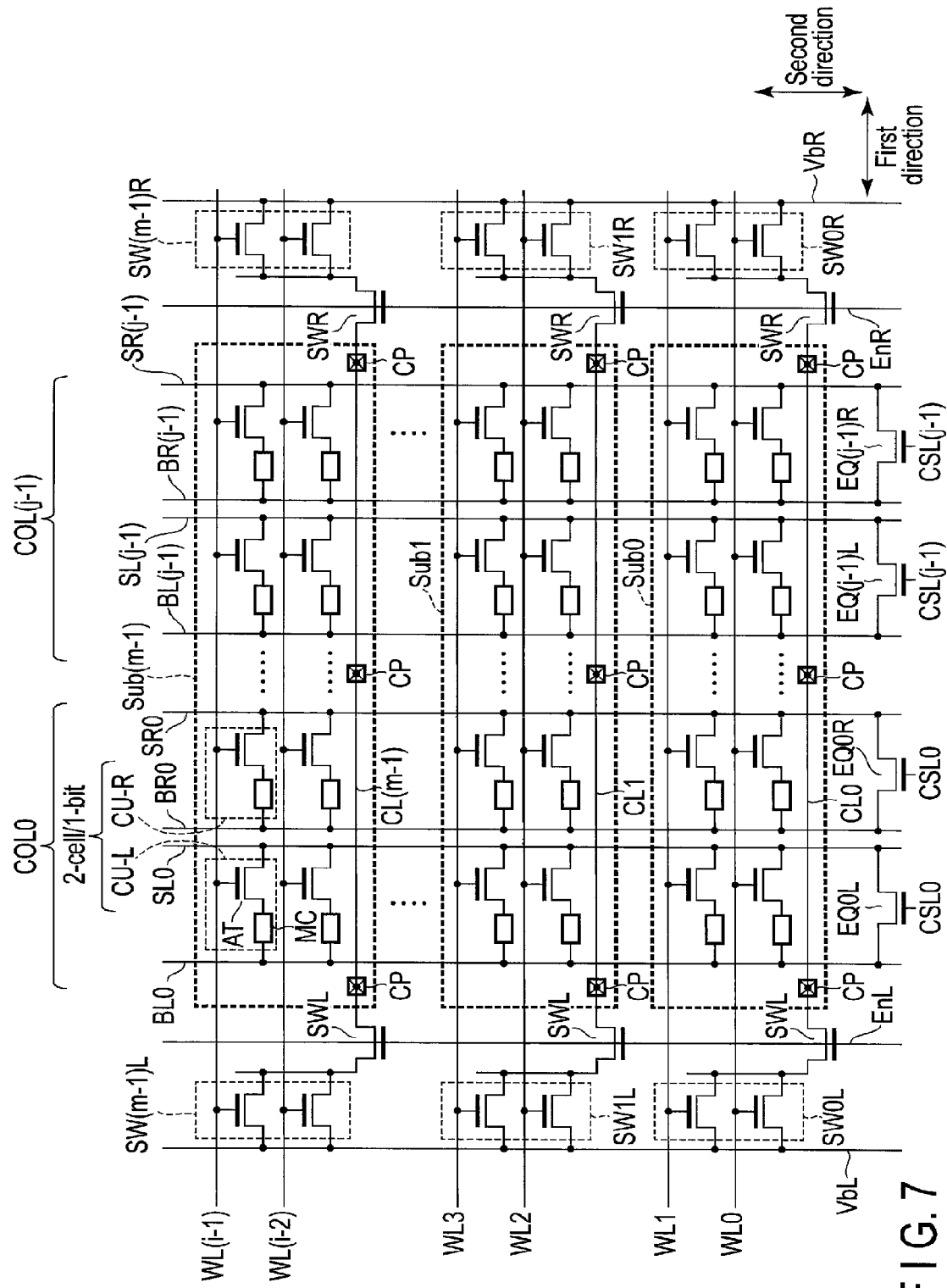
FIG. 7 is a circuit diagram illustrating a memory cell layout of a fourth embodiment.

FIG. 7 illustrates a memory cell layout of the fourth embodiment.

The fourth embodiment differs from the first embodiment in providing equalizer circuits EQ0L, . . . EQ(j-1)L that equalize the potential of bit lines BL0, . . . , BL(j-1) and the potential of source lines SL0, . . . , SL(j-1), and equalizer circuits EQ0R, . . . , EQ(j-1)R that equalize the potential of bit lines BR0, . . . , BR(j-1) and source lines SR0, . . . , SR(j-1).

The equalizer circuits EQ0L, . . . , EQ(j-1)L, EQ0R, . . . , EQ(j-1)R are, for example, FETs each having a gate, a source, and a drain. The equalizer circuits EQ0L, EQ0R are controlled to be on/off by a column select signal CSL0. The equalizer circuits EQ(j-1)L, EQ(j-1)R are controlled to be turned on/off by a column select signal CSL(j-1).

The present embodiment can achieve precise control of the read/write current in reading/writing by previously equalizing the potential of the bit lines and the potential of the source lines before setting the substrate potential of the access region in the memory cell array.

[Operation Example]

An operation example of the nonvolatile semiconductor memory according to the first to fourth embodiments described above is described.

Although a nonvolatile semiconductor memory according to the first embodiment is exemplarily described below, the description can easily be applied to the nonvolatile semiconductor memories according to the second to fourth embodiments.

In the operation described below, the plurality of substrate areas exhibit P-type conductivity and the access transistors in the cell units are N-channel type FETs.

(1) Read Operation

FIG. 8 is a waveform diagram illustrating a first example of operational waveform in reading.

The operational waveform is based on the operation of the nonvolatile semiconductor memory in FIGS. 3A and 3B.

The example improves the read speed by applying the substrate potential to the substrate area Sub(m-1) in reading so as to achieve the forward bias between the substrate area (P-type) Sub(m-1), in which the access transistors ATs in the selected cell units CU-L, CU-R are disposed, and the access transistors ATs (N-type) in the selected cell units CU-L, CU-R.

The read operation is executed in synchronization with a clock signal CLK.

At time t1, the clock signal CLK rises. Synchronously, at time t2, the column select signal CSL0 and the control signal EnL change to the High level. At this time, the column selecting circuit 12 and the switching transistor SWL, for example, in FIG. 3A are turned on.

At time t3, the selected word line WL(i-1) changes to the High level, causing the switching transistor SW(m-1)L in FIG. 3A, for example, to be turned on, and applying Vsub1 (=Vforward) from the potential setting line VbL to the substrate area Sub(m-1), which is the access region, via the switching transistors SWL, SW(m-1)L.

A read current flows from the bit lines BL0, BR0 to the source lines SL0, SR0 in the selected cell units CU-L, CU-R in the column COL0. At this time, a relatively large read current flows in the cell unit of the two cell units CU-L, CU-R that includes the memory cell MC in a low resistance state, compared to the read current flowing in the cell unit that includes the memory cell MC in a high resistance state, according to a ratio of resistance values.

The access transistors ATs in the selected cell units CU-L, CU-R are in the forward-bias state while the read current flows. Therefore, the relatively large read current can flow in the two cell units CU-L, CU-R compared to the read current in the zero bias state.

As a result of this, the difference between the potential VBL of the bit line BL0 and the potential VBR (=VbBL) of the bit line BR0 increases quickly and becomes stable, allowing the sense amplifier 14 to be activated (operated) at earlier timing. Specifically, the activate signal SE is set to the High level at time t4 to activate the sense amplifier 14 and fix an output signal (data) OUT, thus achieving a high speed reading.

At time t4, the control signal EnL is set to the Low level to turn off the switching transistor SWL in FIG. 3B. Specifically, the access transistors ATs in the selected cell units CU-L, CU-R are in the forward bias in term T1 from time t3 to t4.

At time t4 or after time t4, the control signal EnR is set to the High level to turn on the switching transistor SWR in FIG. 3B. Since the switching transistors SWR, SW(m-1)R are turned on, Vsub2(=Vss or Vbackward) is applied from the potential setting line VbR to the substrate area Sub(m-1) via the switching transistors SWR, SW(m-1)R. Vss is the ground potential. Vbackward is a negative potential in this example to achieve reverse bias in the access transistors ATs.

Subsequently, at time t5, the selected word line WL(i-1), the control signal EnR, and the activate signal SE change to the Low level, whereby the read operation ends.

The access transistors ATs in the selected cell units CU-L, CU-R are in the zero bias state (Vsub2=Vss) or in the reverse bias state (Vsub2=Vbackward) in term T2 from time t4 to t5. Specifically, in term T2, the potential of the substrate area Sub(m-1), which is the access region, is reset. Reset means applying the Vss or Vbackward to the substrate area Sub(m-1).

Resetting the substrate area Sub(m-1) after the read operation allows initial state of the substrate area Sub(m-1) to be in the reset state in standby or subsequent reading/writing. This is effective in decreasing the leak current.

Preferably, all substrate areas in the memory cell array are reset at power on of the nonvolatile memory (chip).

Vsub1 is Vforward in the present example, but Vsub1 may be Vss. In this case, the access transistors ATs in the selected cell units CU-L, CU-R are in the zero bias state.

FIG. 9 is a waveform diagram illustrating a second example of operational waveform in reading.

The second example is a modification of the first example. In the description below, what is different from the first example is described and similar parts to those in the first example are not described again.

The example applies the substrate potential (ground potential Vss) to the substrate area Sub(m-1) in reading so as to achieve the zero bias or the reverse bias between the substrate area (P-type) Sub(m-1), in which the access transistors ATs in the selected cell units CU-L, CU-R are disposed, and the access transistors ATs (N-type) in the selected cell units CU-L, CU-R.

At time t1, the clock signal CLK rises. Synchronously, at time t2, the column select signal CSL0 changes to the High level. At this time, the column selecting circuit 12, for example, in FIG. 3A is turned on.

At time t3, the selected word line WL(i-1) changes to the High level, causing the read current to flow from the bit lines BL0, BR0 to the source lines SL0, SR0 in the selected cell units CU-L, CU-R in the column COL0.

At this time, the control signals EnL, EnR are at the Low level, so that the switching transistors SWL, SWR in the FIG. 3A are turned off, causing the substrate area Sub(m-1), which is the access region, to be in the floating state.

As described in the first example (FIG. 8) of the read operation, resetting all substrate areas Sub(m-1) in the memory cell array in advance allows the substrate area Sub(m-1) to be at the ground potential Vss and in the floating state, or at the negative potential Vbackward and in the floating state when the read current flows in the selected cell units CU-L, CU-R.

The read operation can be executed with the access transistors ATs in the selected cell units CU-L, CU-R being in the zero bias or the reverse bias.

(2) Write Operation

FIG. 10 is a waveform diagram illustrating an example waveform in writing.

The operational waveform is based on the operation of the nonvolatile semiconductor memory in FIGS. 3A and 3B.

The example improves the write speed by applying the substrate potential to the substrate area Sub(m-1) in writing so as to achieve the forward bias between the substrate area (P-type) Sub(m-1), in which the access transistors ATs in the selected cell units CU-L, CU-R are disposed, and the source (N-type) of the access transistors ATs in the selected cell units CU-L, CU-R.

A write operation is executed in synchronization with the clock signal CLK.

At time t1, the clock signal CLK rises. Synchronously, the control signal EnL changes to the High level. At this time, the switching transistor SWL, for example, in FIG. 3A is turned on. At time t2, a write enable signal WE and the column select signal CSL0 changes to the High level. At this time, the column selecting circuit 12, for example, in FIG. 3A is turned on.

At time t3, the selected word line WL(i-1) changes to the High level, causing the switching transistor SW(m-1)L in FIG. 3A, for example, to be turned on, and applying Vsub1 (=Vforward) from the potential setting line VbL to the substrate area Sub(m-1), which is the access region, via the switching transistors SWL, SW(m-1)L.

A write current corresponding to write data flows in the selected cell units CU-L, CU-R in the column COL0.

In writing "0", for example, the write current flows from the bit line BL0 to the source line SL0 in the cell unit CU-L, while the write current flows from the source line SR0 to the bit line BR0 in the cell unit CU-R (BL0, SR0=High level, SL0, BR0=Low level).

In writing "1", the write current flows from the bit line BL0 to the source line SL0 in the cell unit CU-L, while the write current flows from the source line SR0 to the bit line BR0 in the cell unit CU-R (BL0, SR0=Low level, SL0, BR0=High level).

The access transistors ATs in the selected cell units CU-L, CU-R are in the forward bias state when the write current flows. Therefore, a larger read current can flow in the two cell units CU-L, CU-R.

As a result, high speed writing can be achieved.

At time t4, the control signal EnL is set to the Low level to turn off the switching transistor SWL in FIG. 3B. Specifically, the access transistors ATs in the selected cell units CU-L, CU-R are in the forward bias state in term T1 from time t3 to t4.

At time t4 or after time t4, the control signal EnR is set to the High level to turn on the switching transistor SWR in FIG. 3B. Since the switching transistors SWR, SW(m-1)R are turned on, Vsub2(=Vss or Vbackward) is applied from the potential setting line VbR to the substrate area Sub(m-1) via the switching transistors SWR, SW(m-1)R. Vss is the ground potential. Vbackward is a negative potential in this example to achieve reverse bias in the access transistors ATs.

Subsequently, at time t5, the selected word line WL(i-1) and the control signal EnR change to the Low level, whereby the write operation ends.

The access transistors ATs in the selected cell units CU-L, CU-R are in the zero bias state (Vsub2=Vss) or in the reverse bias state (Vsub2=Vbackward) in term T2 from time t4 to t5. Specifically, in term T2, the potential of the substrate area Sub(m-1), which is the access region, is reset.

Resetting the substrate area Sub(m-1) after the write operation allows the initial state of the substrate area Sub (m-1) to be in the reset state in standby or subsequent reading/writing. This is effective in decreasing the leak current.

Similar to the read operation, all substrate areas in the memory cell array are preferably reset at power on of the nonvolatile memory (chip) in the write operation.

Vsub1 is Vforward in the present example, but Vsub1 may be Vss. In this state, the access transistors ATs in the selected cell units CU-L, CU-R are in the zero bias state.

The write operation may be executed when the access transistors are in the forward bias state or the zero bias state depending on whether the high speed writing is required.

For example, the high speed writing (writing in the forward bias state) is selected to prevent overflow of a buffer memory when an amount of data larger than a predetermined amount of data is temporally stored in the buffer memory. Normal writing (writing in the zero bias state) is selected when the predetermined amount or a smaller than the predetermined amount of data is temporally stored in the buffer memory.

Further, the writing in the forward bias state or in the zero bias state may be determined depending on the magnitude (voltage value) or width (application time) of the write pulse. Still further, the bias state (forward bias state or zero bias state) in reading/writing, the bias value (substrate potential), or the like may also be determined to provide a sufficient margin between the write current and the read current.

[Example of Device Structure]

An example of device structure is described.

Figure 11:
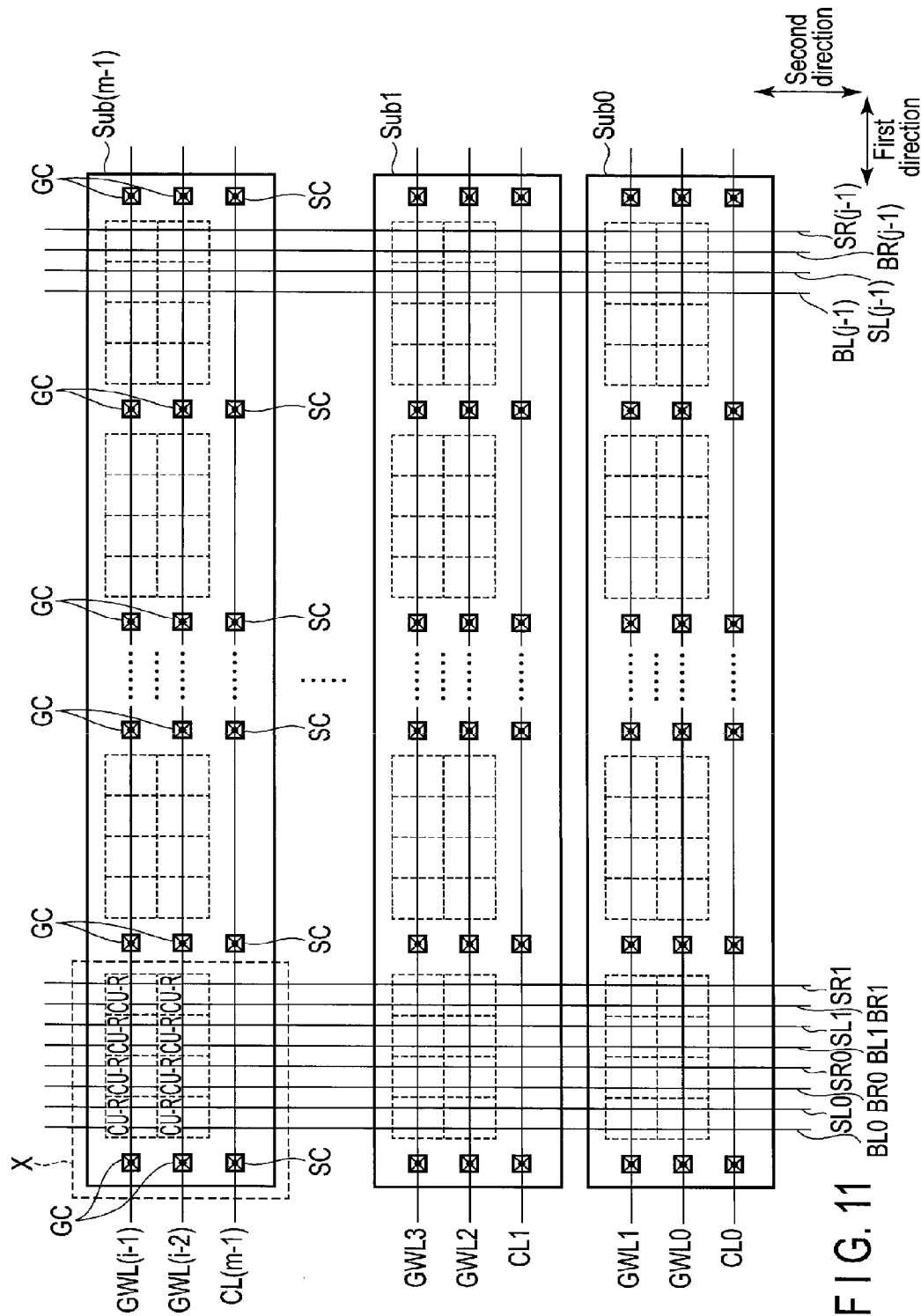
FIG. 11 is a plan view illustrating a memory cell layout of a fifth embodiment.
Figure 12:
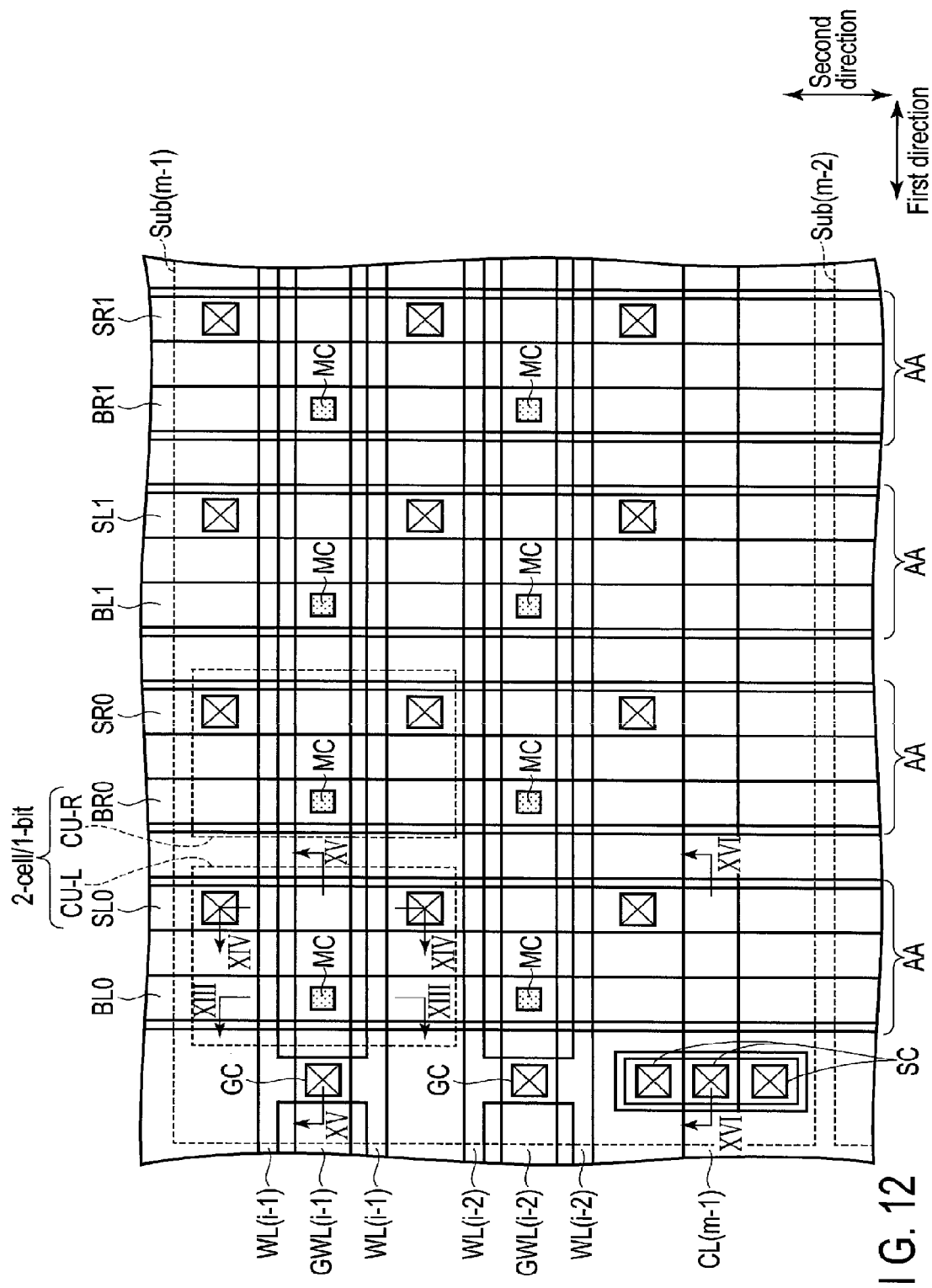
FIG. 12 is a plan view illustrating region X in FIG. 11.

FIG. 11 illustrates a memory cell layout of a fifth embodiment. FIG. 12 is a detailed plan view of the layout in region X in FIG. 11.

There are m substrate areas Sub0, Sub1, . . . , Sub(m-1) disposed in the second direction. There are i global word lines GWL0, GWL1, . . . , GWL(i-2), GWL(i-1) extending in the first direction. The global word lines GWL0, GWL1, . . . , GWL(i-2), GWL(i-1) correspond to, for example, the word lines WL0, . . . , WL1, WL(i-2), WL(i-1) of the first to fourth embodiments described above.

Two global word lines correspond to one substrate area in this example, but it is not limited thereto. One or more global word lines need to correspond to a substrate area.

There are m substrate contact lines CL0, CL1, . . . , CL(m-1) extending in the first direction. The substrate contact lines CL0, CL1, . . . , CL(m-1) correspond to, for example, the substrate contact lines CL0, CL1, . . . , CL(m-1) of the first to fourth embodiments described above.

There are j bit lines BL0, BL1, . . . , BL(j-1) and j source lines SL0, SL1, . . . , SL(j-1), each extending in the first direction. Similarly, there are j bit lines BR0, BR1, . . . , BR(j-1) and j source lines SR0, SR1, . . . , SR(j-1), each extending in the second direction.

The bit lines BL0, BL1, . . . , BL(j-1), BR0, BR1, . . . , BR(j-1) and the source lines SL0, SL1, . . . , SL(j-1), SR0, SR1, . . . , SR(j-1) correspond to the bit lines BL0, BL1, . . . , BL(j-1), BR0, BR1, . . . , BR(j-1) and the source lines SL0, SL1, . . . , SL(j-1), SR0, SR1, . . . , SR(j-1) in the first to fourth embodiments described above.

The global word lines GWL0, GWL1, . . . , GWL(i-2), GWL(i-1) each connected electrically to the word lines WL0, WL1, . . . , WL(i-2), WL(i-1) disposed in lower layers via a plurality of contact plugs GCs. For example, the contact plugs GCs are arranged at a fixed pitch in the first direction. In this example, four cell units (indicated by rectangles of dotted lines) CU-R, CU-L are arranged among the contact plugs GCs in the first direction.

The substrate contact lines CL0, CL1, . . . , CL(m-1) are each connected electrically to the substrate areas Sub0, Sub1, . . . , Sub(m-1) via the contact plugs SCs. For example, the contact plugs SCs are arranged at the same pitch as the pitch of the contact plugs GCs in the first direction. This eliminates the need for providing a new region for arranging the contact plugs SCs.

The contact plugs SCs may be arranged at a pitch different from the pitch of the contact plugs GCs in the first direction.

In this example, the cell unit CU-L includes two access transistors ATa, ATb, for example, as illustrated in FIG. 17. This is to increase the read/write current to be supplied to the memory cell MC by two access transistors Ata, ATb. This layout is effective when the size (driving force) of the access transistors decreases due to miniaturization.

The two access transistors ATa, ATb correspond to the access transistor AT in the first to fourth embodiments.

FIG. 13 is a cross-sectional view cut along line XIII-XIII of FIG. 12. FIG. 14 is a cross-sectional view cut along line XIV-XIV of FIG. 12. FIG. 15 is a cross-sectional view cut along line XV-XV of FIG. 12. FIG. 16 is a cross-sectional view cut along line XVI-XVI of FIG. 12.

The substrate area Sub(m-1) is formed in a semiconductor substrate 21. As illustrated in these drawings, the substrate area Sub(m-1) includes a P-type well region 22 when the access transistors ATa, ATb are N-channel FETs. The substrate area Sub(m-1) includes an N-type well region when the access transistors are P-channel FETs.

The substrate area Sub(m-1) includes a plurality of element regions AAs divided by element isolation insulating layers STIs. The access transistors ATa, ATb are disposed in each of the plurality of element regions AAs. The access transistors ATa, ATb each include the word line WL(i-1), as a gate electrode, and a source/drain region 23. The source/drain region 23 is, for example, an N-type impurity diffusing layer in the P-type well region.

In this example, the access transistors ATa, ATb are buried-gate type transistors. For example, the word line WL(i-1) as the gate electrode fills a recess in the substrate area Sub(m-1). Specifically, a gate insulating layer (e.g., silicon oxide layer) 24 is formed inside the recess, and the word line WL(i-1) is formed on the gate insulating layer 24 as the gate electrode.

The buried gate-type access transistors ATa, ATb can effectively prevent a short channel effect caused by miniaturization. The access transistors ATa, ATb may not be the buried gate type transistors, and normal transistors (FETs) in which the gate electrode is formed over the surface of the semiconductor substrate may be used.

A lower electrode 25 is disposed on one of the source/drain regions 23, and the memory cell MC is disposed on the lower electrode 25. The bit line BL0 is connected with the upper surface of the memory cell MC.

The source line SL0 is connected to the other region of the source/drain regions 23 via the contact plug CP. The global word line GWL(i-1) is connected to the word line WL(i-1) via the contact plug GC. The substrate contact line CL(m-1) is connected to the P-type well region 22, which is the substrate area Sub(m-1), via the contact plug SC.

An interlayer insulating layer 26 covers the access transistors ATa, ATb and the memory cell MC.

In the device structure of this example, the bottom surface of the P-type well region 22, which is the substrate area Sub(m-1), is located lower than the bottom surface of an element isolation insulating layer STI. Thus, the substrate potential (back-gate bias) can be applied to the entire P-type well region 22, which is the substrate area Sub(m-1), from the substrate contact line CL(m-1) via the contact plug SC.

Adjacent two substrate areas can be electrically isolated from each other by, for example, the semiconductor substrate (N-type) 21 or the N-type well region in the semiconductor substrate 21. In the former case, the memory cell array is formed in, for example, a double well structure. In the latter case, the memory cell array is formed in, for example, a triple well structure.

[Hierarchical Bit Line Structure]

The embodiments described above can be applied to nonvolatile semiconductor memories having a hierarchical bit line structure.

The nonvolatile semiconductor memories have thinner and longer bit lines and larger resistance values of the bit lines in accordance with further miniaturization of the memory cells or larger memory cell capacities.

This is solved using an architecture (hierarchical bit line structure) in which the memory cell array is divided into a plurality of blocks on which global bit/source lines having low resistance are arranged, and the global bit/source lines are connected to local bit/source lines.

The hierarchical bit line structure can decrease time (latency) from the reading instruction until data can be read from the sense amplifier. The use of the hierarchical bit line structure in the nonvolatile semiconductor memory is a very effective method for cache memories that require high speed access.

FIG. 18 illustrates a nonvolatile semiconductor memory having the hierarchical bit line structure.

There are k sub-arrays (blocks) MAT0, MAT1, . . . , MAT(k-1) arranged, for example, in the second direction. k is a natural number equal to or larger than 2.

The global bit lines GBL, GBR and the global source lines GSL, GSR extend in the second direction and are connected to the k sub-arrays (blocks) MAT0, MAT1, . . . , MAT(k-1).

The global bit lines GBL, GBR are further connected to a sense amplifier 14 and a read/write control circuit 17. The global source lines GSL, GSR are further connected to the read/write control circuit 17.

The sense amplifier 14 and the read/write control circuit 17 respectively correspond to the sense amplifier 14 and the read/write control circuit 17 in the FIG. 1.

FIGS. 19 and 20 illustrate a layout of the sub-arrays and peripheral circuits thereof.

Peripheral circuits 16a, 16b are disposed at both ends of the sub-array MAT(k-1) in the second direction. Specifically, the sub-array MAT(k-1) is arranged between the peripheral circuits 16a, 16b.

A plurality of, for example, 256 sets of sub-arrays MAT (k-1) are provided. A set includes j (j is a natural number equal to or larger than 2) columns COL0, . . . , COL(j-1). j is, for example, 8. The global bit lines GBL, GBR and the global source lines GSL, GSR are provided for each set.

The global bit lines GBL, GBR are connected to the peripheral circuit 16a. The peripheral circuit 16a includes a column selecting circuit 12 that connects the global bit lines GBL, GBR to local bit lines BLy, BRy in one of the j columns COL0, . . . , COL(j-1). y is a number from 0 to (j-1).

The column selecting circuit 12 corresponds to the column selecting circuit 12 in FIGS. 3A and 3B. Equalizer circuits EQ0L, . . . , EQ(j-1)L, EQ0R, . . . , EQ(j-1)R correspond to the equalizer circuits EQ0L, . . . , EQ(j-1)L, EQ0R, . . . , EQ(j-1)R in FIG. 7.

The global source lines GSL, GSR are connected to a peripheral circuit 16b. The peripheral circuit 16b includes a column selecting circuit 12 that connects the global source lines GSL, GSR to local source lines SLy, SRy in one of the j columns COL0, . . . , COL(j-1). y is a number from 0 to (j-1).

The column selecting circuit 12 corresponds to the column selecting circuit 12 in FIGS. 3A and 3B. Equalizer circuits EQ0L, . . . , EQ(j-1)L, EQ0R, . . . , EQ(j-1)R correspond to the equalizer circuits EQ0L, . . . , EQ(j-1)L, EQ0R, . . . , EQ(j-1)R in FIG. 7.

A potential setting line VbL is connected to a peripheral circuit 16c. The peripheral circuit 16c includes switching transistors SWL, SW0L, . . . , SW(m-1)L that connect the potential setting line VbL to one of m substrate contact lines CL0, . . . , CL(m-1) in the sub-array MAT(k-1). The switching transistors SWL, SW0L, . . . , SW(m-1)L correspond to the switching transistors SWL, SW0L, . . . , SW(m-1)L in FIG. 2.

A potential setting line VbR is connected to a peripheral circuit 16d. The peripheral circuit 16d includes switching transistors SWR, SW0R, . . . , SW(m-1)R that connect the potential setting line VbR to one of the m substrate contact lines CL0, . . . , CL(m-1) in the sub-array MAT(k-1). The switching transistors SWR, SW0R, . . . , SW(m-1)R correspond to the switching transistors SWR, SW0R, . . . , SW(m-1)R in FIG. 2.

In this example, a substrate area Subz corresponds to a word line WLz. Specifically, i=m, where z is a number from 0 to i (or z).

[Application Example]

Processors used in portable information terminals require low power consumption. In one example of lowering power consumption of the processors, a cache memory formed of a static random access memory (SRAM) that requires a large standby power is replaced by a nonvolatile semiconductor memory using a nonvolatile semiconductor element.

Specifically, the SRAM tends to exhibit a larger leak power according to further micronization of the transistor in operation and in standby (non-operation). Replacing the cache memory by the nonvolatile semiconductor memory allows the power source to be shut off in standby, thus decreasing the power consumption in standby.

For example, a study has been made to use a magnetic random access memory (MRAM) as a cache memory to provide a low power consumption processor.

The MRAM is one of the nonvolatile semiconductor memories that are currently proposed using a memory technology capable of satisfying three characteristics, i.e., a high rewriting durability, operation performance capable of high speed reading/writing, and a cell area allowing high integration. The MRAM used as a cache increases the possibility of installing a large-capacity and high-speed nonvolatile cache memory.

The embodiments described above use technology that is effective to provide such a large-capacity and high-speed nonvolatile cache memory. A low power consumption processor system capable of using the above-described embodiments is described.

FIG. 21 illustrates an example low power consumption processor system.

A CPU 31 controls an SRAM 32, a DRAM 33, a flash memory 34, a ROM 35, and an MRAM (magnetic random access memory) 36.

The MRAM 36 can be used in place of the SRAM 32, the DRAM 33, the flash memory 34, or the ROM 35. Accordingly, at least one of the SRAM 32, the DRAM 33, the flash memory 34, and ROM 35 may be eliminated.

The MRAM 36 can be used as a nonvolatile cache memory (e.g., as an L2 cache).

FIG. 22 illustrates a basic structure of a magnetoresistive element.

A magnetoresistive element MTJ is an example memory cell in the embodiments described above. The magnetoresistive element MTJ is in a layered structure of a storage layer (ferromagnetic layer) 1 magnetized vertically and variably in a direction (vertical direction) vertical to a film surface, a tunnel barrier layer (nonmagnetic layer) 2, and a reference layer (ferromagnetic layer) 3 magnetized vertically and invariably, and these layers are arranged in this order.

As used herein, "magnetized invariably" means that the magnetizing direction does not change before and after the writing, while magnetized variably means that the magnetizing direction is reversed after the writing.

Writing means spin transfer writing in which a spin injection current (spin-polarized electrons) is made to flow in a magnetoresistive element MTJ to apply spin torque to the storage layer 1 in magnetization.

For example, when the spin injection current flows from the storage layer 1 to the reference layer 3, spin-polarized electrons, which have been polarized in the same direction as the magnetizing direction of the reference layer 3, are injected into the storage layer 1. This provides spin torque to the magnetization in the storage layer 1, causing the storage layer 1 and the reference layer 3 to have the same magnetization direction (parallel state).

In contrast, when the spin injection current flows from the reference layer 3 to the storage layer 1, the spin-polarized electrons, which have been polarized in a direction opposite to the magnetizing direction of the reference layer 3 among the electrons flowing from the storage layer 1 to the reference layer 3, are returned into the storage layer 1. This provides spin torque to the magnetization in the storage layer 1, causing the storage layer 1 and the reference layer 3 to have the opposite magnetization directions (anti-parallel state).

The resistance value of the magnetoresistive element MTJ changes by the magnetoresistive effect depending on a relative magnetization direction between the reference layer 3 and the storage layer 1. Specifically, the resistance value of the magnetoresistive element MTJ decreases in the parallel state and increases in the anti-parallel state. Assuming the resistance value in the parallel state to be R0 and the resistance in the anti-parallel state to be R1, the value determined by (R1−R0)/R0 is called a magnetoresistive ratio (MR ratio).

The magnetization of the reference layer 3 is fixed in a direction toward the storage layer 1 side, but the direction may be fixed toward the direction opposite to the storage layer 1. The vertical positional relationship between the reference layer 3 and the storage layer 1 is not limited in disposing the magnetoresistive element MTJ on the semiconductor substrate.

For example, the magnetoresistive element MTJ is called a top-pin type magnetoresistive element MTJ when the reference layer 3 is located above the storage layer 1. In contrast, the magnetoresistive element MTJ is called a bottom-pin-type magnetoresistive element MTJ when the reference layer 3 is lower than the storage layer 1.

FIG. 23 illustrates an example magnetoresistive element including a shift cancel layer.

The magnetoresistive element MTJ is in a layered structure of a storage layer (ferromagnetic layer) 1 magnetized vertically and variably in a vertical direction, a tunnel barrier layer (nonmagnetic layer) 2, and a reference layer (ferromagnetic layer) 3 magnetized vertically and invariably, and these layers are arranged in this order.

The magnetoresistive element MTJ also includes, on the reference layer 3 side, a shift cancel layer (ferromagnetic layer) 4 that is magnetized vertically and invariably. A nonmagnetic layer (e.g., metal layer) 5 is disposed between the reference layer 3 and the shift cancel layer 4.

The reference layer 3 and the storage layer 1 are magnetized vertically in this example. In this case, a stray magnetic field from the reference layer 3 is directed toward the magnetization direction (vertical direction) of the storage layer 1, a stray magnetic field having a large vertical component is applied to the storage layer 1. The stray magnetic field acts in a direction that allows the storage layer 1 to be magnetized in the same direction (parallel state) as the magnetization of the reference layer 3.

This shifts an RH curve of the storage layer 1.

Specifically, it is sufficient to flow a small spin injection current in the magnetoresistive element MTJ in order to change the magnetoresistive element MTJ from the anti-parallel state to the parallel state. In contrast, a large spin injection current is needed to flow in the magnetoresistive element MTJ in order to change the magnetoresistive element MTJ from the parallel state to the anti-parallel state.

The anti-parallel state is unstable due to the stray magnetic field from the reference layer 3.

Specifically, the storage layer 1 cannot hold the anti-parallel state when the stray magnetic field is larger than coercive force of the storage layer 1. Even if the stray magnetic field is smaller than the holding force of the storage layer 1, the magnetization of the storage layer 1 would be reversed from the anti-parallel state to the parallel state due to the fluctuation of magnetization by thermal agitation.

The shift cancel layer 4 is provided to solve such a problem.

In this example, the reference layer 3 and the shift cancel layer 4 are layered on top of each other.

In this case, the magnetization direction of the shift cancel layer 4 is set to be opposite to the magnetization direction of the reference layer 3. This allows cancellation of shifting of an RH curve of the storage layer 1 by offsetting the stray magnetic field from the reference layer 3 by the cancelling magnetic field from the shift cancel layer 4 in the storage layer 1.

CONCLUSION

As described above, the embodiments can prevent the write error and the erroneous writing in reading.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory comprising:
a semiconductor substrate including a plurality of substrate contact lines;
a first substrate area in the semiconductor substrate, including a first substrate contact line;
a first cell unit in the first substrate area, the first cell unit including a first memory cell and a first transistor, and the first transistor having a control terminal connected to a first word line, using the first substrate area as a channel and supplying a read current or a write current to the first memory cell; and
a substrate potential setting circuit connected to the plurality of substrate contact lines, setting the first substrate area by the first substrate contact line to a first substrate potential when the read current is supplied to the first memory cell, and setting the first substrate area to a second substrate potential different from the first substrate potential when the write current is supplied to the first memory cell.

2. The memory of claim 1, wherein
the first substrate area is P-type,
the first transistor is an N-channel FET,
the first substrate potential and the second substrate potential are positive potential, and
an absolute value of the second substrate potential is larger than an absolute value of the first substrate potential.

3. The memory of claim 2, wherein
the substrate potential setting circuit sets the first substrate area to negative potential after reading or writing of the first memory cell is completed with the read current or the write current.

4. The memory of claim 1, wherein
the first substrate area is N-type,
the first transistor is a P-channel FET,
the first substrate potential and the second substrate potential are negative potential, and
an absolute value of the second substrate potential is larger than an absolute value of the first substrate potential.

5. The memory of claim 4, wherein
the substrate potential setting circuit sets the first substrate area to positive potential after reading or writing of the first memory cell is completed with the read current or the write current.

6. The memory of claim 1, wherein
the substrate potential setting circuit sets the first substrate area to a third substrate potential different from the first substrate potential or the second substrate potential, after having set the first substrate area to the first substrate potential or the second substrate potential.

7. The memory of claim 6, further comprising:
a second substrate area in the semiconductor substrate, the second substrate area being electrically isolated from the first substrate area; and
a second cell unit in the second substrate area, the second cell unit including a second memory cell and a second transistor, and the second transistor having a control terminal connected to a second word line, using the second substrate area as a channel and supplying a read current or a write current to the second memory cell, wherein
the substrate potential setting circuit sets the second substrate region to the third substrate potential when the read current or the write current is supplied to the first memory cell.

8. The memory of claim 1, further comprising:
a switch element having a control terminal connected to the first word line to transfer the first substrate potential or the second substrate potential to the first substrate area.

9. The memory of claim 1, wherein
the first memory cell and the second memory cell each have a first magnetic layer, a second magnetic layer, and a nonmagnetic layer disposed between the first magnetic layer and the second magnetic layer.

10. A nonvolatile semiconductor memory comprising:
a semiconductor substrate including a plurality of substrate contact lines;
a first substrate area in the semiconductor substrate, including a first substrate contact line;
a first cell unit in the first substrate area, the first cell unit including a first memory cell and a first transistor, and the first transistor having a control terminal connected to a first word line, using the first substrate area as a channel and supplying a read current or a write current to the first memory cell; and
a switch element connected to the first substrate contact line and having a control terminal connected to the first word line to transfer the potential of the first word line to the first substrate area when the read current or the write current is supplied to the first memory cell.

11. The memory of claim 10, wherein
the first substrate area is P-type,
the first transistor is an N-channel FET, and
the potential of the first word line is a positive potential.

12. The memory of claim 10, wherein
the first substrate area is N-type,
the first transistor is a P-channel FET, and
the potential of the first word line is a negative potential.

13. The memory of claim 10, further comprising:
a second substrate area in the semiconductor substrate, the second substrate area being electrically isolated from the first substrate area; and
a second cell unit in the second substrate area, the second cell unit including a second memory cell and a second transistor, and the second transistor having a control terminal connected to a second word line, using the second substrate area as a channel and supplying a read current or a write current to the second memory cell, wherein
the second substrate area is set to a substrate potential different from the potential of the first word line when the read current or the write current is supplied to the first memory cell.

* * * * *